(12) United States Patent
Yoon et al.

(10) Patent No.: US 12,389,783 B2
(45) Date of Patent: *Aug. 12, 2025

(54) DISPLAY PANEL

(71) Applicant: Samsung Display Co., Ltd., Yongin-Si (KR)

(72) Inventors: Youngsoo Yoon, Yongin-si (KR); Jaewon Kim, Yongin-si (KR); Hyunae Park, Yongin-si (KR); Hyungjun Park, Yongin-si (KR); Seungwoo Sung, Yongin-si (KR); Nuree Um, Yongin-si (KR); Ilgoo Youn, Yongin-si (KR); Jieun Lee, Yongin-si (KR); Donghyeon Jang, Yongin-si (KR); Seunghan Jo, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/671,381

(22) Filed: Feb. 14, 2022

(65) Prior Publication Data

US 2022/0165811 A1    May 26, 2022

Related U.S. Application Data

(63) Continuation of application No. 16/698,864, filed on Nov. 27, 2019, now Pat. No. 11,251,235.

(30) Foreign Application Priority Data

Nov. 30, 2018 (KR) .................. 10-2018-0153027

(51) Int. Cl.
*G09G 3/3233* (2016.01)
*H10K 59/121* (2023.01)
(Continued)

(52) U.S. Cl.
CPC ........... *H10K 59/88* (2023.02); *G09G 3/3233* (2013.01); *H10K 59/1213* (2023.02);
(Continued)

(58) Field of Classification Search
CPC ............... G09G 3/3233; G09G 3/3666; H01L 27/3223; H01L 27/3276
See application file for complete search history.

(56) References Cited

U.S. PATENT DOCUMENTS 8,237,357 B2   8/2012   Takei et al.
8,890,181 B2   11/2014  Wang et al.
(Continued)

FOREIGN PATENT DOCUMENTS

CN    101442068 A    5/2009
CN    105390095 A    3/2016
(Continued)

OTHER PUBLICATIONS

China Office Action dated Nov. 1, 2022, CN Patent Application No. 201911179927.5.
(Continued)

*Primary Examiner* — Kevin M Nguyen
(74) *Attorney, Agent, or Firm* — Innovation Counsel LLP

(57) ABSTRACT

A display panel may include a substrate, pixels, dummy pixels, and voltage lines. The substrate may include a first transmission region for light transmission and/or sound transmission, a non-display area surrounding the first transmission region, and a display area surrounding the non-display area. The pixels may be arranged on the display area and may emit light. The dummy pixels may be arranged on the non-display area, may include a first dummy pixel, and may emit no light. The voltage lines may transmit voltages to the pixels and the dummy pixels. The voltage lines may include a first voltage line and a second voltage line. The (Continued)

first voltage line may be spaced from the second voltage line, may be aligned with the second voltage line, and may overlap the first dummy pixel. The first transmission region may be positioned between the first voltage line and the second voltage line.

16 Claims, 20 Drawing Sheets

(51) Int. Cl.
*H10K 59/122* (2023.01)
*H10K 59/131* (2023.01)
*H10K 59/88* (2023.01)

(52) U.S. Cl.
CPC ....... *H10K 59/1216* (2023.02); *H10K 59/122* (2023.02); *H10K 59/131* (2023.02)

(56) References Cited

U.S. PATENT DOCUMENTS

| | | | |
|---|---|---|---|
| 9,941,489 B2 | 4/2018 | Pyon et al. | |
| 10,229,964 B2 | 3/2019 | Kim et al. | |
| 10,460,656 B2 | 10/2019 | Xi et al. | |
| 10,490,119 B2 | 11/2019 | Kim et al. | |
| 10,504,446 B2 | 12/2019 | Kim et al. | |
| 11,251,235 B2* | 2/2022 | Yoon | G09G 3/3225 |
| 2008/0225216 A1* | 9/2008 | Shimodaira | G02F 1/1362 |
| | | | 349/143 |
| 2009/0309489 A1* | 12/2009 | Takata | H10K 59/131 |
| | | | 313/504 |
| 2014/0198268 A1* | 7/2014 | Sugita | G06F 3/0412 |
| | | | 349/12 |
| 2015/0325593 A1 | 11/2015 | Shih et al. | |
| 2015/0372067 A1 | 12/2015 | Kim | |
| 2017/0154566 A1* | 6/2017 | Ryoo | G09G 3/3648 |
| 2018/0151660 A1 | 5/2018 | Kim et al. | |
| 2018/0151834 A1 | 5/2018 | Kanaya | |
| 2018/0164850 A1 | 6/2018 | Sim et al. | |
| 2018/0190190 A1* | 7/2018 | Xi | G09G 3/3208 |
| 2018/0204889 A1 | 7/2018 | Yu et al. | |
| 2018/0219058 A1* | 8/2018 | Xiang | H10K 59/60 |
| 2018/0315357 A1 | 11/2018 | Nam et al. | |
| 2019/0073976 A1 | 3/2019 | Yeh et al. | |
| 2019/0132536 A1 | 5/2019 | Watanabe et al. | |
| 2019/0155428 A1* | 5/2019 | Lee | G06F 3/04164 |
| 2021/0096697 A1* | 4/2021 | Do | G06F 3/0448 |

FOREIGN PATENT DOCUMENTS

| | | |
|---|---|---|
| CN | 107564412 A | 1/2018 |
| CN | 107633807 A | 1/2018 |
| CN | 107749247 A | 3/2018 |
| CN | 107871767 A | 4/2018 |
| CN | 107908031 A | 4/2018 |
| CN | 107942564 A | 4/2018 |
| CN | 108039148 A | 5/2018 |
| CN | 108122956 A | 6/2018 |
| CN | 108461522 A | 8/2018 |
| CN | 108469697 A | 8/2018 |
| CN | 108630735 A | 10/2018 |
| CN | 108648615 A | 10/2018 |
| EP | 3300067 A2 | 3/2018 |
| EP | 3364460 A1 | 8/2018 |
| KR | 10-0666639 B1 | 1/2007 |
| KR | 10-1372014 B1 | 3/2014 |
| KR | 10-2018-0049296 A | 5/2018 |
| KR | 10-2018-0065722 A | 6/2018 |

OTHER PUBLICATIONS

Chinese Office Action corresponding to Application No. 201911179927.5 and dated Apr. 20, 2023, 12 pages.
European search report dated Jan. 27, 2025, for related European Application No. 24217913.3 15 pages.

* cited by examiner

DISPLAY PANEL

CROSS-REFERENCE TO RELATED PATENT APPLICATIONS

This application is a continuation application of U.S. patent application Ser. No. 16/698,864 filed on Nov. 27, 2019, which claims priority to Korean Patent Application No. 10-2018-0153027 filed on Nov. 30, 2018 in the Korean Intellectual Property Office; the prior applications are incorporated by reference.

BACKGROUND

1. Field

The technical field relates to a display panel.

2. Description of the Related Art

Applications of display devices are many. Due to reduced thickness and weight, applications of display devices have increased.

For enhancing applications, functions may be added or linked to display devices.

SUMMARY

One or more embodiments may be related to a display panel including areas for accommodating a camera, a sensor, etc. inside a display area. One or embodiments may be related to a device including the display panel.

According to one or more embodiments, a display panel includes a substrate including a first region, a second region, a non-display area that surrounds the first region and the second region, and a display area that surrounds the non-display area; a plurality of pixels arranged on the display area; a plurality of dummy pixels arranged on the non-display area and emitting no light; and a plurality of driving voltage lines configured to transmit a driving voltage to the plurality of pixels and the plurality of dummy pixels, wherein some of the plurality of driving voltage lines are cut around the first region and the second region and cut portions of the plurality of driving voltage lines are arranged on some of the plurality of dummy pixels.

The plurality of dummy pixels may surround the first region and the second region.

Each of the plurality of pixels may include a pixel circuit and a display element, the pixel circuit including at least one transistor and the display element being connected to the pixel circuit. Each of the plurality of dummy pixels may include a dummy pixel circuit including at least one dummy transistor. A structure of the pixel circuit may be same as a structure of the dummy pixel circuit.

The display panel may include a pixel defining layer arranged on the pixel circuit and the dummy pixel circuit and including an opening corresponding to each of the plurality of pixels. The pixel defining layer may have a flat upper surface in accordance with the dummy pixel.

The display panel may further include an organic emission layer arranged within the opening of the pixel defining layer in correspondence with the pixel. The organic emission layer may be arranged on an upper surface of the pixel defining layer in correspondence with the dummy pixel.

The display panel may further include a first common layer, an organic emission layer, and a second common layer sequentially stacked on each other and arranged within the opening of the pixel defining layer in correspondence with the pixel. The first common layer and the second common layer may contact an upper surface of the pixel defining layer in correspondence with the dummy pixel.

The display panel may further include a pixel electrode connected to the pixel circuit, an intermediate layer arranged within the opening of the pixel defining layer, and an opposite electrode arranged on the intermediate layer, in correspondence with the pixel. The opening may expose the pixel electrode, and the opposite electrode may contact an upper surface of the pixel defining layer in correspondence with the dummy pixel.

The display panel may further include a plurality of electrode voltage lines each extending to intersect with the plurality of driving voltage lines. The plurality of electrode voltage lines may be connected to the plurality of driving voltage lines via contact holes to form a mesh structure.

Some of the plurality of electrode voltage lines may be cut around the first region and the second region and cut portions of the plurality of electrode voltage lines may be arranged on some of the plurality of dummy pixels.

Each of the plurality of dummy pixels may include a dummy pixel circuit, the dummy pixel circuit may include a driving thin-film transistor and a storage capacitor that overlaps the driving thin-film transistor, and one electrode of the storage capacitor may be provided as some of the plurality of electrode voltage lines.

According to one or more embodiments, a display panel includes a substrate including a first region, a second region, a non-display area that surrounds the first region and the second region, and a display area that surrounds the non-display area; a plurality of pixels arranged on the display area; a plurality of dummy pixels arranged on the non-display area and emitting no light; and a plurality of driving voltage lines configured to transmit a driving voltage to the plurality of pixels and the plurality of dummy pixels, wherein first driving voltage lines from among the plurality of driving voltage lines are cut around the first region and the second region, and second driving voltage lines from among the plurality of driving voltage lines are continuous in the non-display area.

Cut portions of the first driving voltage lines may be arranged on some of the plurality of dummy pixels.

The plurality of dummy pixels may be arranged to surround the first region and the second region.

The display panel may further include a plurality of electrode voltage lines each extending to intersect with the plurality of driving voltage lines. The plurality of electrode voltage lines may be connected to the plurality of driving voltage lines via contact holes to form a mesh structure.

Some of the plurality of electrode voltage lines may be cut around the first region and the second region, and cut portions of the plurality of electrode voltage lines may be arranged on some of the plurality of dummy pixels.

Each of the plurality of dummy pixels may include a dummy pixel circuit, the dummy pixel circuit may include a driving thin-film transistor and a storage capacitor that overlaps the driving thin-film transistor, and one electrode of the storage capacitor may be provided as some of the plurality of electrode voltage lines.

A size of the first region may be greater than a size of the second region.

The plurality of dummy pixels may surround the first region and the second region, and the number of rows of dummy pixels that surround the first region may be less than the number of rows of dummy pixels that surround the second region.

A shape of the non-display area may be in connection with a shape of the first region and a shape of the second region.

The display panel may further include a third region spaced apart from the first region and the second region in the non-display area. The first region, the second region, and the third region may be opening areas or transmissive areas that transmit light or sound.

An embodiment may be related to a display panel. The display panel may include a substrate, emitting pixels, dummy pixels, and driving voltage lines. The substrate may include a first transmission region for at least one of light transmission and sound transmission, a non-display area that surrounds the first transmission region, and a display area that surrounds the non-display area. The emitting pixels may be arranged on the display area, may include a first emitting pixel, and may emit light. The dummy pixels may be arranged on the non-display area, may include a first dummy pixel, and may emit no light. The driving voltage lines may transmit driving voltages to the emitting pixels and the dummy pixels. The driving voltage lines may include a first driving voltage line and a second driving voltage line. The first driving voltage line may be spaced from the second driving voltage line, may be aligned with the second driving voltage line, and may overlap the first dummy pixel. The first transmission region may be positioned between the first driving voltage line and the second driving voltage line.

The dummy pixels may surround the first transmission region.

The first emitting pixel may include a pixel circuit and a display element. The pixel circuit may include at least one transistor. The display element may be electrically connected to the pixel circuit. The first dummy pixel comprises a dummy pixel circuit. The dummy pixel circuit may include at least one dummy transistor. A structure of the pixel circuit may be same as a structure of the dummy pixel circuit.

The display panel may include a pixel defining layer arranged on the pixel circuit and the dummy pixel circuit. The pixel defining layer may include an opening corresponding to the first emitting pixel. The pixel defining layer may have a flat surface overlapping the first dummy pixel.

The display panel may include an organic emission layer. A first portion of the organic emission layer may be arranged within the opening of the pixel defining layer. A second portion of the organic emission layer may overlap the dummy pixel and may be positioned farther from the substrate than the first portion of the organic emission layer.

The display panel may include a first common layer, an organic emission layer, and a second common layer sequentially stacked on each other. A first portion of the first common layer, a first portion of the organic emission layer, and a first portion of the second common layer may be arranged within the opening of the pixel defining layer. A second portion of the first common layer and a second portion of the second common layer each overlap the dummy pixel and may be positioned farther from the substrate than the first portion of the first common layer and the first portion of the second common layer, respectively.

The display panel may include a pixel electrode connected to the pixel circuit, an intermediate layer arranged within the opening of the pixel defining layer, and an opposite electrode arranged on the intermediate layer. A first portion of the opposite electrode may overlap the pixel electrode. A second portion of the opposite electrode may overlap the dummy pixel and may be positioned farther from the substrate than the first portion of the opposite electrode.

The display panel may include electrode voltage lines intersecting the driving voltage lines and electrically connected to the driving voltage lines via contact holes to form a conductive mesh structure.

The dummy pixels may include a second dummy pixel. The electrode voltage lines may include a first electrode voltage line and a second electrode voltage line. The first electrode voltage line may be spaced from the second electrode voltage line, may be aligned with the second electrode voltage line, and may overlap the second dummy pixel. The first transmission region may be positioned between the first electrode voltage line and the second electrode voltage line.

The first dummy pixel may include a dummy pixel circuit. The dummy pixel circuit may include a driving thin-film transistor and a storage capacitor that overlaps the driving thin-film transistor. One electrode of the storage capacitor may be one of the electrode voltage lines.

An embodiment may be related to a display panel. The display panel may include a substrate, emitting pixels, dummy pixels, and driving voltage lines. The substrate may include a first transmission region for at least one of light transmission and sound transmission, a non-display area that surrounds the first transmission region, and a display area that surrounds the non-display area. The emitting pixels may be arranged on the display area, may include a first pixel, and may emit light. The dummy pixels may be arranged on the non-display area, may include a first dummy pixel, and may emit no light. The driving voltage lines may transmit driving voltages to the emitting pixels and the dummy pixels. The driving voltage lines may include a first driving voltage line, a second driving voltage line, and a third driving data line. The first driving voltage line may be spaced from the second driving voltage line and may be aligned with the second driving voltage line. The first transmission region may be positioned between the first driving voltage line and the second driving voltage line. The third driving voltage line may intersect a boundary of the non-display area at least twice and may be longer than each of the first driving voltage line and the second driving voltage line.

The first driving voltage line may overlap the first dummy pixel.

The dummy pixels may surround the first transmission region.

The display panel may include electrode voltage lines intersecting the driving voltage lines and electrically connected to the driving voltage lines via contact holes to form a conductive mesh structure.

The dummy pixels may include a second dummy pixel. The electrode voltage lines may include a first electrode voltage line and a second electrode voltage line. The first electrode voltage line may be spaced from the second electrode voltage line, may be aligned with the second electrode voltage line, and may overlap the second dummy pixel. The first transmission region may be positioned between the first electrode voltage line and the second electrode voltage line.

The first dummy pixel may include a dummy pixel circuit. The dummy pixel circuit may include a driving thin-film transistor and a storage capacitor that overlaps the driving thin-film transistor. One electrode of the storage capacitor may be one of the electrode voltage lines.

The display panel may include a second transmission region surrounded by the first non-display area and smaller than the first transmission region.

The total number of dummy pixels that surround the first transmission region without surrounding the second transmission region may be less than the total number of dummy pixels that surround the second transmission region without surrounding the first transmission region.

Two edges of the non-display area may be opposite each other and may be positioned between the first transmission region and the second transmission region. A distance between the two edges of the non-display area may be less than at least one of a maximum width of the first transmission region and a maximum width of the second transmission region.

The display panel may include a second transmission region and a third transmission region both spaced apart from the first region and both surrounded by the non-display area. A first subset of the dummy pixels may be positioned between the first transmission region and the second transmission region. A second subset of the dummy pixels may be positioned between the second transmission region and the third transmission region.

DETAILED DESCRIPTION

Figure 1:
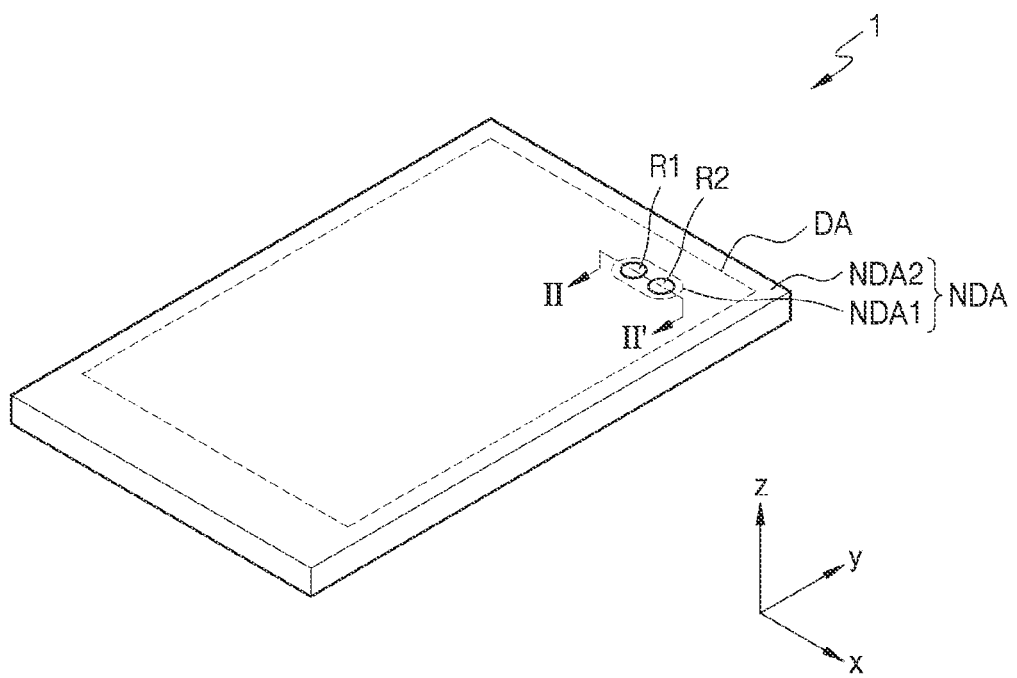
FIG. 1 is a schematic perspective view of a display device according to an embodiment.

Example embodiments are described with reference to the accompanying drawings. The described embodiments may be embodied in many different forms.

Identical or analogous components may be given the same reference numeral, and related descriptions may not be repeated.

Although the terms "first," "second," etc. may be used to describe various components, these components should not be limited by these terms. These terms are used to distinguish one component from another. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

The singular forms "a", "an" and "the" may represent the plural forms as well, unless the context clearly indicates otherwise.

The terms "comprises" and/or "comprising" may specify the presence of stated features or components, but may not preclude the presence or addition of one or more other features or components.

When a first element is referred to as being "on," "connected to," or "coupled to" a second element, the first element can be directly or indirectly on, connected to, or coupled to the second element. One or more intervening elements may be present between the first element and the second element.

Sizes of elements in the drawings may be exaggerated for convenience of explanation.

When a certain embodiment may be implemented differently, a specific process order may be performed differently. For example, two consecutively described processes may be performed substantially at the same time or performed in an order opposite to the described order.

The term "connect" or the term "couple" may mean "electrically connect" or "electrically couple."

FIG. 1 is a schematic perspective view of a display device 1 according to an embodiment.

Referring to FIG. 1, the display device 1 includes a display area DA that may emit light and a non-display area NDA that does not emit light.

The display device 1 may provide an image through the display area DA. The display device 1 may include a liquid crystal display (LCD), an electrophoretic display, an organic light-emitting display, an inorganic light-emitting display, a quantum-dot light emitting display, a field emission display, a surface-conduction electron-emitter display, a plasma display, or a cathode ray display.

The display device 1 may be an organic light-emitting display according to an embodiment.

The display device 1 includes a first region R1 and a second region R2. In/on the first region R1 and the second region R2, electronic elements are arranged. The first and second regions R1 and R2 may be/include openings (e.g., cavities or through holes) and/or transmission areas capable of transmitting light or/and sound from or to the electronic elements. One, two, three, or more openings and/or transmission areas may be included in the display device 1.

According to an embodiment, at the first region R1 and the second region R2, a light transmittance may be about 30% or greater, 50% or greater, 70% or greater, 80% or greater, or 85% or greater.

The non-display area NDA may include a first non-display area NDA1 surrounding the regions R1 and R2 and may include a second non-display area NDA2 surrounding the display area DA. The first non-display area NDA1 may entirely surround the first and second regions R1 and R2, the display area DA may entirely surround the first non-display area NDA1, and the second non-display area NDA2 may entirely surround the display area DA.

The regions R1 and R2 are positioned on the upper right side of the display area DA in FIG. 1. According to an embodiment, locations of the first region R1 and the second region R2 may be different from those illustrated in FIG. 1.

Figure 2A:
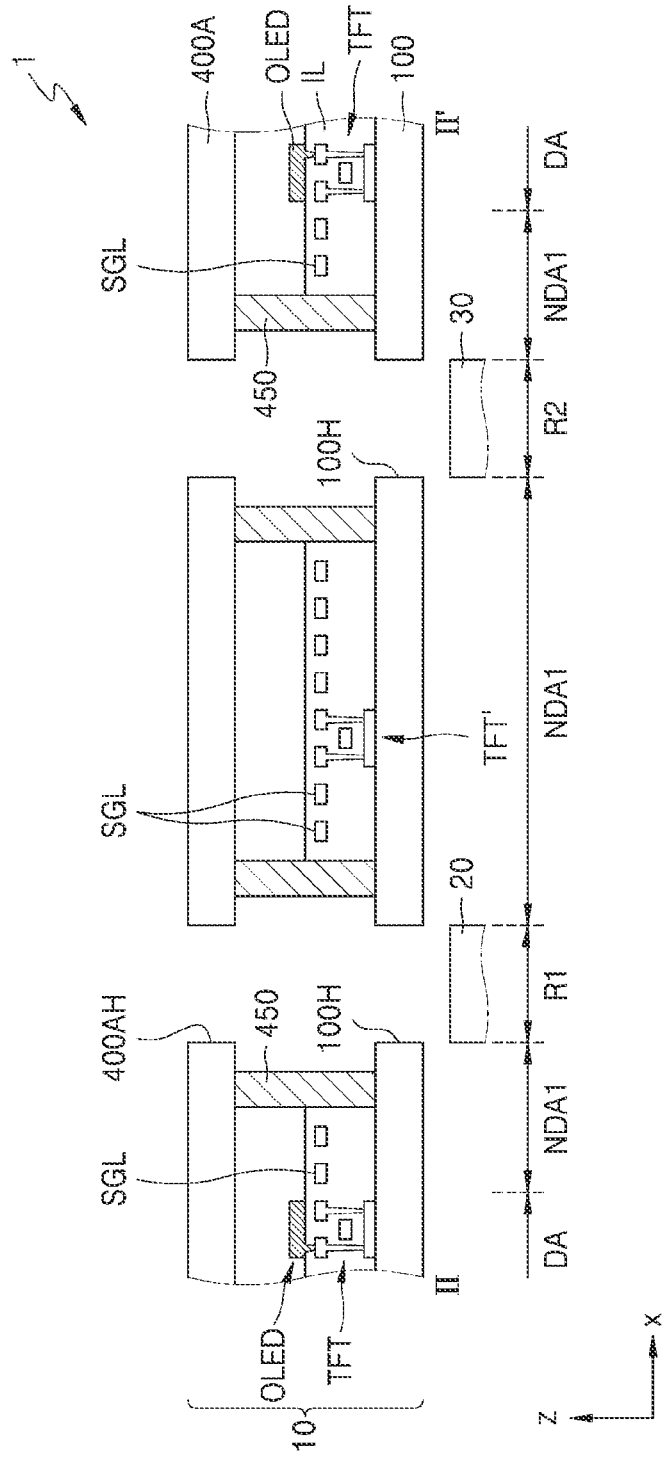
FIG. 2A, FIG. 2B, and FIG. 2C each illustrate a cross-sectional view of a display panels according to an embodiment.
Figure 2B:
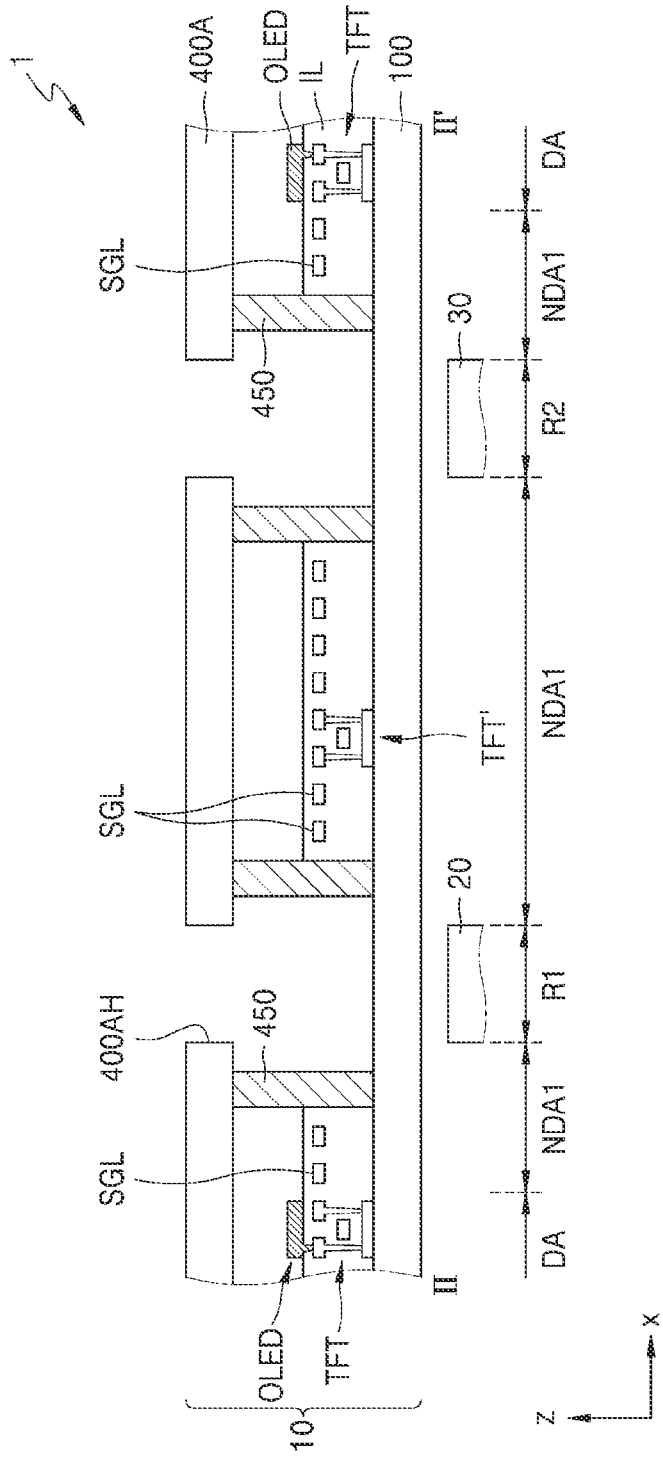
Figure 2C:
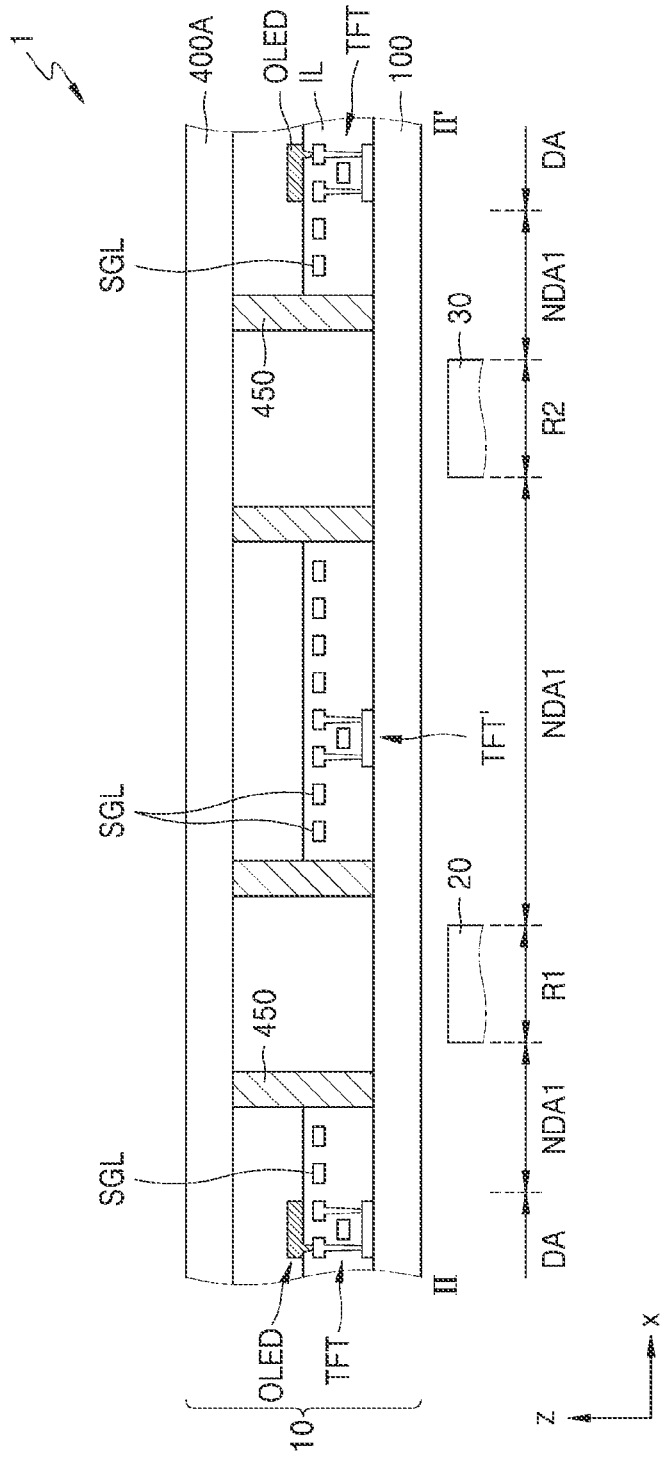

FIGS. 2A to 2C each illustrate a schematic cross-sectional view of the display device 1 taken along line II-II' of FIG. 1 according to an embodiments.

Referring to FIG. 2A, the display device 1 may include a display panel 10 and electronic elements 20 and 30 respectively corresponding to the regions R1 and R2 of the display panel 10. Although not shown, one or more components, such as an input sensing member for sensing a touch input, an anti-reflection member including a polarizer and a retarder, or a color filter and a black matrix, and a transparent window, may be arranged on/in the display panel 10.

The display panel 10 may include a substrate 100, an encapsulation substrate 400A that faces the substrate 100, and a sealing member 450 between the substrate 100 and the encapsulation substrate 400A.

The substrate 100 may include glass or polymer resin. Examples of the polymer resin may include polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). The substrate 100 including polymer resin may be flexible, rollable, or bendable. The substrate 100 may have a multi-layered structure including a polymer resin layer and an inorganic layer (not shown). The encapsulation substrate 400A may include glass or polymer resin.

A thin-film transistor TFT, an organic light-emitting diode OLED connected to the thin-film transistor TFT, and signal lines SGL are arranged on the display area DA of the substrate 100 (which corresponds to the display area DA of the display device 1). Signal lines SGL and a dummy thin-film transistor TFT' are arranged on the first non-display area NDA1 of the substrate 100.

Signal lines SGL may provide certain signals (e.g., a data signal and a scan signal) to display elements spaced apart from each other in a y direction about the regions R1 and R2.

The display panel 10 may include through holes corresponding to the regions R1 and R2. For example, the substrate 100 and the encapsulation substrate 400A may include through holes 100H and through holes 400AH, respectively, wherein the through holes 100H correspond to the regions R1 and R2 and the through holes 400AH correspond to the regions R1 and R2. Portions of an insulating layer IL or elements between the substrate 100 and the encapsulation substrate 400A that correspond to the regions R1 and R2 may be all removed.

FIG. 2A illustrates that sealing members 450 are arranged on opposite sides of each of the regions R1 and R2. When viewed in a direction perpendicular to a main surface of the substrate 100, i.e., in a plan view of the display panel 10, each of the regions R1 and R2 may be entirely surrounded by the sealing members 450.

The electronic elements 20 and 30 may be located in the regions R1 and R2, respectively. The electronic elements 20 and 30 may be electronic elements that use, input, and/or output light or sound. For example, an electronic element may be a sensor that receives and uses light (like an infrared sensor), a camera that receives light and captures an image, a sensor that outputs and senses light or sound to measure a distance or recognize a fingerprint, a small lamp that outputs light, or a speaker that outputs sound. An electronic element using light may use light in one or more of various wavelength bands, such as visible light, infrared light, and/or ultraviolet light.

Since the display panel 10 includes through holes corresponding to the regions R1 and R2, as in FIG. 2A, light or sound may be effectively output or received by the electronic elements 20.

Some elements of the display panel 10 may not include through holes that correspond to the regions R1 and R2. For example, as illustrated in FIG. 2B, the encapsulation substrate 400A may include through holes 400AH corresponding to the regions R1 and R2 but the substrate 100 may include no through holes. Alternatively, as illustrated in FIG. 2C, both the encapsulation substrate 400A and the substrate 100 may not include through holes corresponding to the regions R1 and R2. As illustrated in FIGS. 2B and 2C, even though the substrate 100 does not include the through hole 100H, the insulating layer IL and/or elements between the substrate 100 and the encapsulation substrate 400A may include cavities that correspond to the regions R1 and R2, and thus sufficient light transmittance may be provided for operations of the electronic elements 20 and 30. When the display device 1 includes any of the display panels 10 of FIGS. 2B and 2C, the electronic elements 20 and 30 may be electronic elements that use light.

Figure 3A:
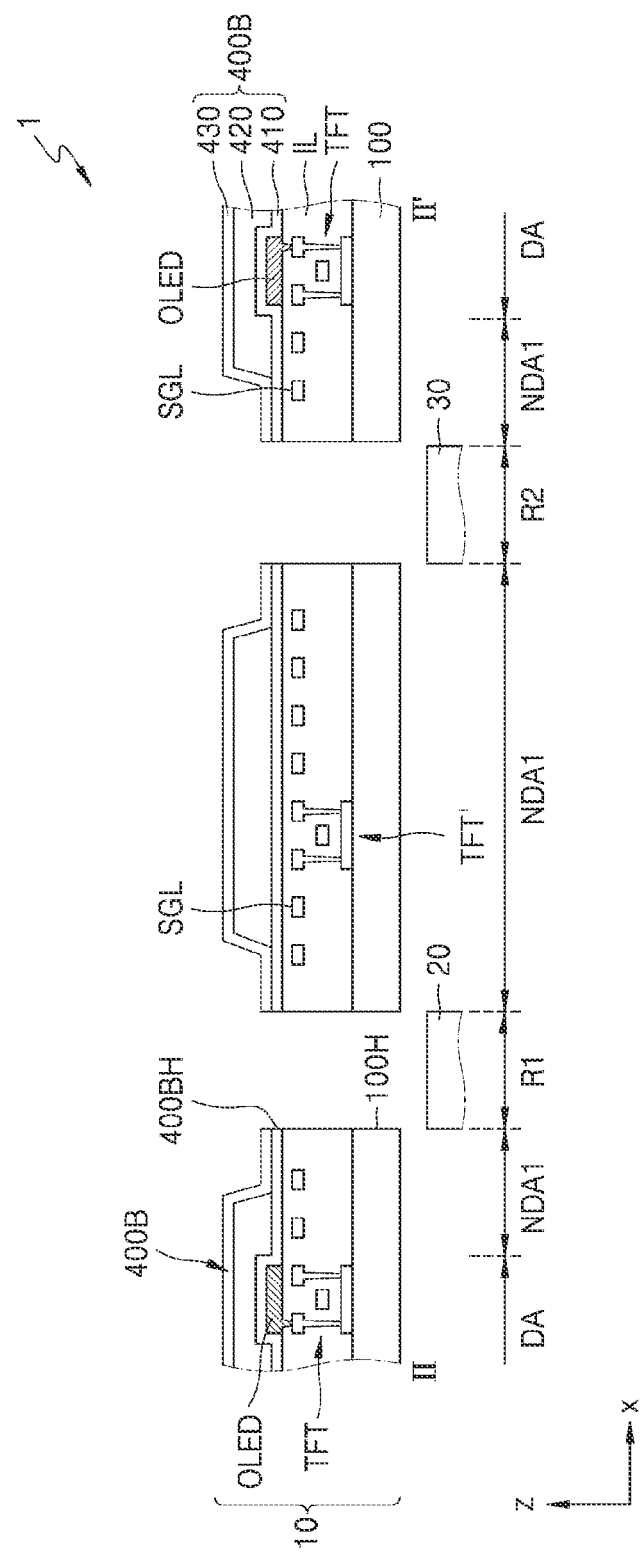
FIG. 3A, FIG. 3B, and FIG. 3C each illustrate a cross-sectional view of a display panel according to an embodiment.
Figure 3B:
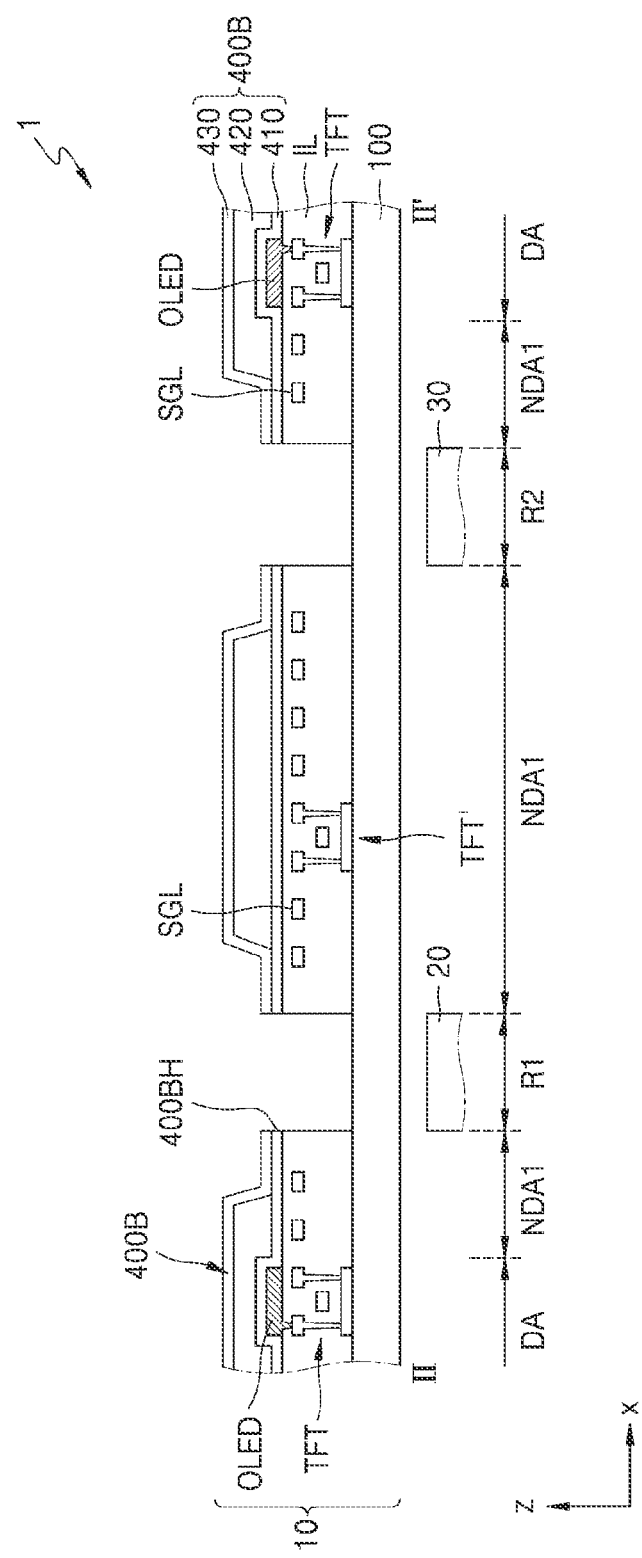
Figure 3C:
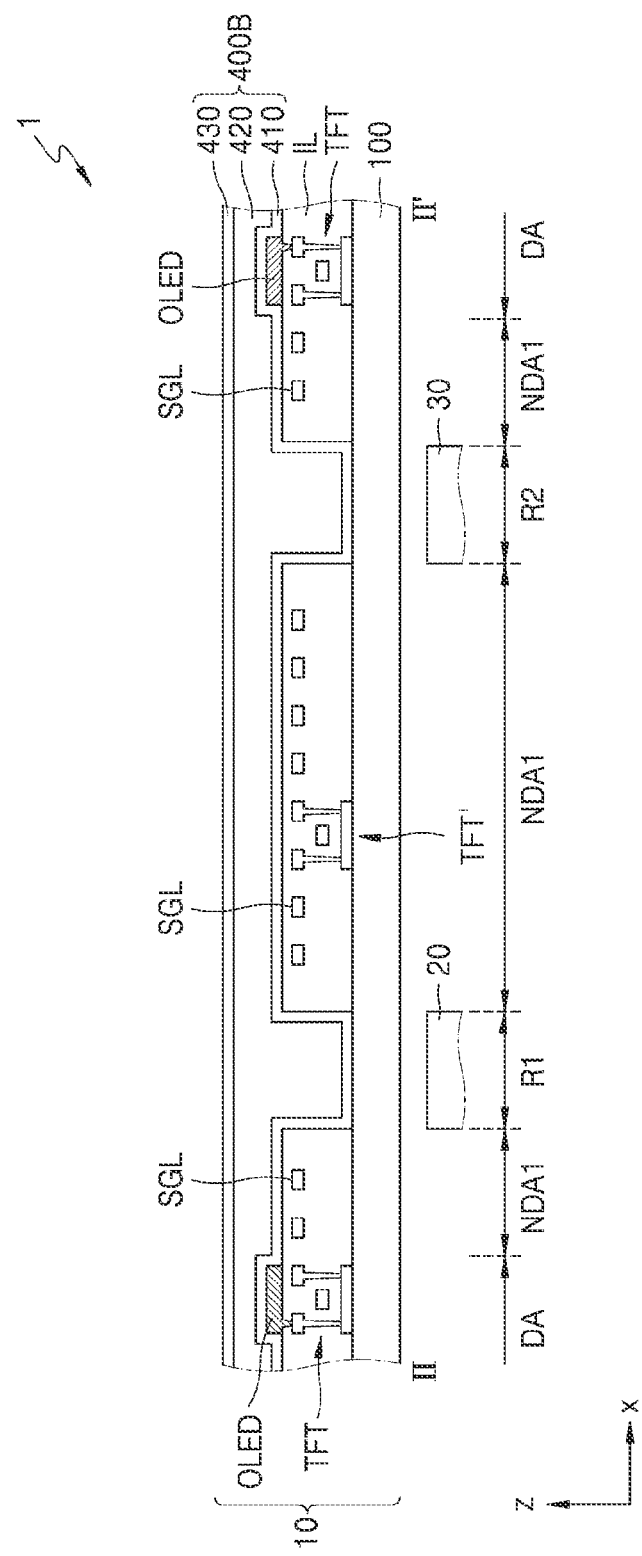

FIGS. 3A to 3C each illustrate a schematic cross-sectional view of the display device 1 taken along line II-II' of FIG. 1 according to an embodiment.

Similar to the display device 1 described above with reference to FIG. 2A, the display device 1 of FIG. 3A may include a display panel 10 including a display element, and electronic elements 20 and 30 respectively corresponding to regions R1 and R2 of the display panel 10. Although not shown, the display device 1 may further include an input detection member for sensing a touch input, a reflection prevention member, a window, etc. arranged on the display panel 10.

The display panel 10 may include a thin-film encapsulation layer 400B, for enhancing flexibility.

The thin-film encapsulation layer 400B may include at least one inorganic encapsulation layer and at least one organic encapsulation layer. FIG. 3A illustrates inorganic encapsulation layers 410 and 430 and an intervening organic encapsulation layer 420.

The inorganic encapsulation layers 410 and 430 may include at least one inorganic insulating material, such as aluminum oxide, titanium oxide, tantalum oxide, hafnium oxide, zinc oxide, silicon oxide, silicon nitride, and/or silicon oxynitride. The organic encapsulation layer 420 may include a polymer-based material. Examples of the polymer-based material may include acrylic resin, epoxy resin, polyimide, and polyethylene.

The display panel 10 may include through holes corresponding to the regions R1 and R2. For example, the substrate 100 and the thin-film encapsulation layer 400B may include through holes 100H and through holes 400BH, respectively. The electronic elements 20 and 30 using light or sound may be arranged in the regions R1 and R2, respectively.

As illustrated in FIG. 3B, the thin-film encapsulation layer 400B may include the through holes 400BH corresponding to the regions R1 and R2, but the substrate 100 may include no through holes. Alternatively, as illustrated in FIG. 3C, both the thin-film encapsulation layer 400B and the substrate 100 may not include through holes corresponding to the regions R1 and R2. As illustrated in FIGS. 3B and 3C, even though the substrate 100 does not include the through holes 100H, an insulating layer IL and/or elements between the substrate 100 and the thin-film encapsulation layer 400B may include through holes and/or cavities that correspond to the regions R1 and R2, thus sufficient light transmittance may be enabled for operations of the electronic elements 20 and 30.

When the thin-film encapsulation layer 400B includes the through holes 400BH as shown in FIGS. 3A and 3B, each of the at least one inorganic encapsulation layer and the at least one organic encapsulation layer may include holes corresponding to the through holes 400BH. In this case, the holes of each organic encapsulation layer are made larger than those of each inorganic encapsulation layer, and thus the inorganic encapsulation layers 410 and 430 may directly contact each other around the regions R1 and R2.

When the thin-film encapsulation layer 400B includes no through holes as shown in FIG. 3C, each of the at least one inorganic encapsulation layer and the at least one organic encapsulation layer may cover the regions R1 and R2. The insulating layer IL between the substrate 100 and the thin-film encapsulation layer 400B may include through holes and/or cavities. Portions of the insulating layer IL that correspond to the regions R1 and R2 are completely removed in FIG. 3A. In an embodiment, only portions of some of multiple layers that constitute the insulating layer IL may be removed.

Figure 4:
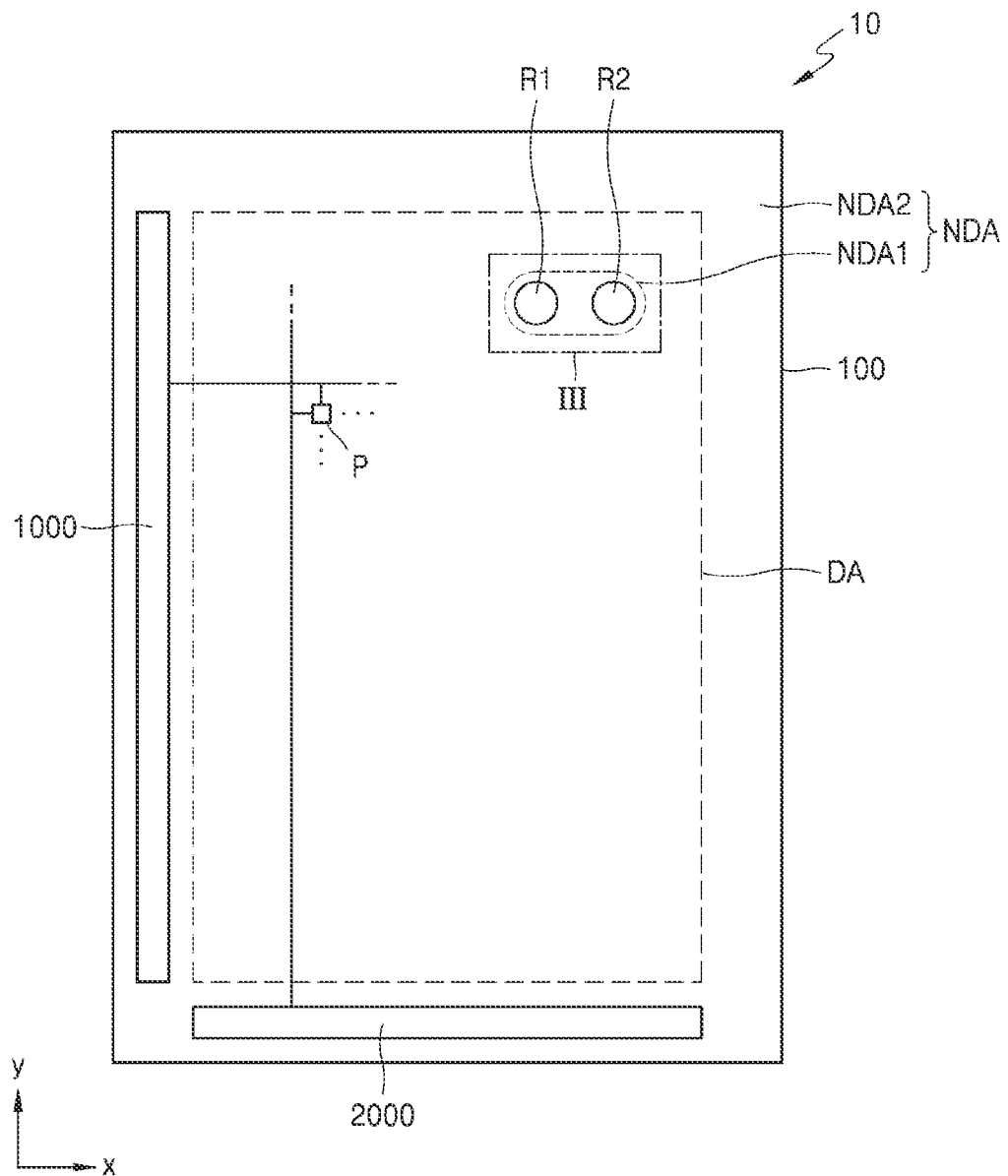
FIG. 4 is a schematic plan view of a display panel according to an embodiment.
Figure 5A:
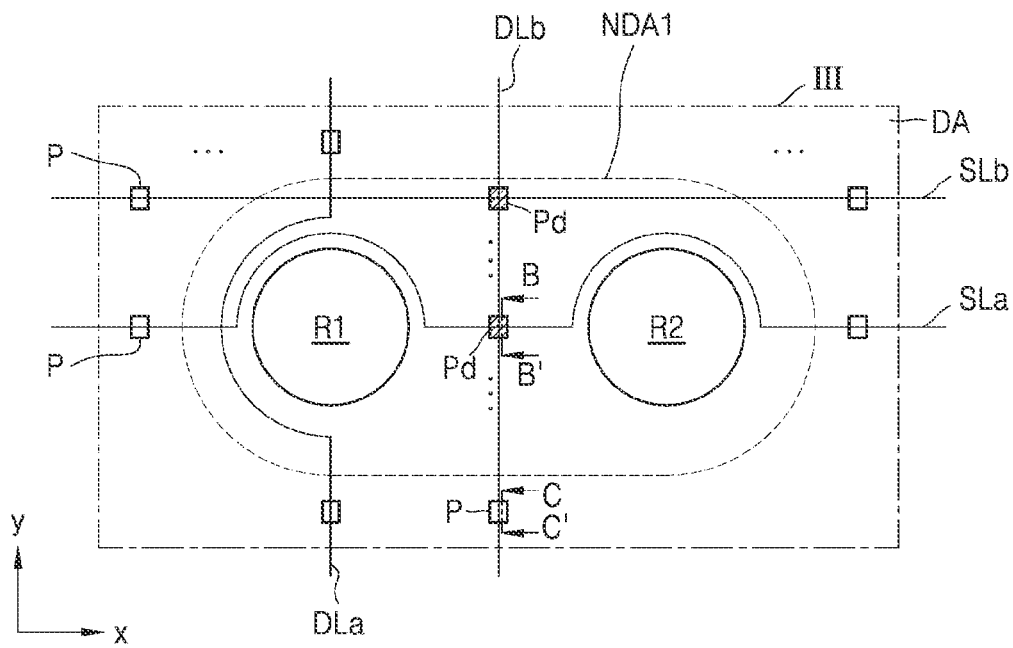
FIG. 5A is a plan view of an embodiment of a region III of FIG. 4.
Figure 5B:
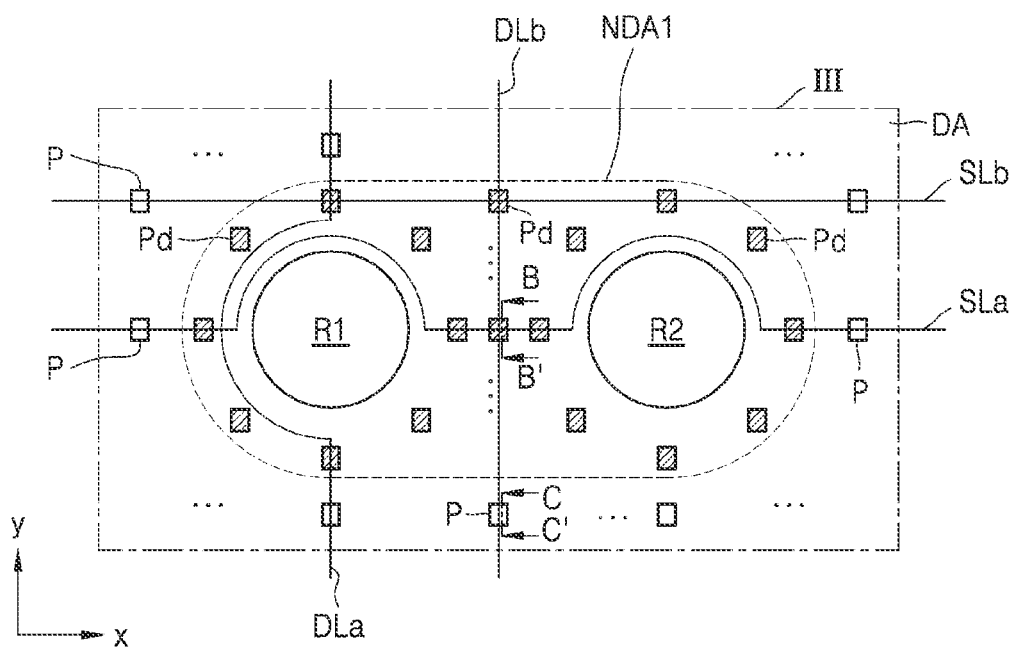
FIG. 5B is a plan view of an embodiment of the region III of FIG. 4.

FIG. 4 is a schematic plan view of a display panel 10 according to an embodiment, and FIGS. 5A and 5B each illustrate a plan view of a region III of FIG. 4 according to an embodiment.

Referring to FIG. 4 and FIG. 5A or FIG. 5B, the display panel 10 includes a plurality of pixels P arranged in the display area DA. Each of the pixels P may include a display element, such as an organic light-emitting diode. The pixel PX may emit, for example, red light, green light, blue light, or white light using the organic light-emitting diode. The display area DA may be protected against external air or moisture by an encapsulation member described above with reference to FIGS. 2A to 3C.

The first non-display area NDA1 surrounds the regions R1 and R2. The first non-display area NDA1 is not for displaying images. Signal lines that provide signals to the pixels P around the regions R1 and R2 may be arranged in the first non-display area NDA1. Dummy pixels Pd that do not emit light are arranged in the first non-display area NDA1.

The second non-display area NDA2 may include a scan driver 1000 that provides scan signals to the pixels P and the dummy pixels Pd, a data driver 2000 that provides data signals to the pixels P and the dummy pixels Pd, and a main power line (not shown) for providing a driving voltage and a common voltage.

FIGS. 5A and 5B are plan views of the region III of FIG. 4.

Referring to FIGS. 5A and 5B, the first region R1 and the second region R2 are arranged (and aligned) in a first direction, the first non-display area NDA1 surrounds the first region R1 and the second region R2, and the display area DA surrounds the first non-display area NDA1.

Pixels P are arranged in the display area DA, and dummy pixels Pd are arranged in the first non-display area NDA1. A plurality of signal lines may electrically connect the pixels P to the dummy pixels Pd. FIG. 5A illustrates that scan lines SLa and SLb, each extending substantially in the first direction (x direction), connect pixels P in the display area DA to dummy pixels Pd in the first non-display area NDA1 and illustrates that (data line DLa and) data line DLb may electrically connect pixels P to dummy pixels Pd substantially in a second direction (y direction) may intersect the scan lines SLa and SLb.

Some scan lines SLa may each extend substantially in the first direction (x direction) to provide signals to the pixels P positioned on opposite sides (e.g., the left and right sides) of the first non-display area NDA1 and to the dummy pixels Pd positioned in the first non-display area NDA1, but may bypass (or detour around) the first region R1 and the second region R2 in the first non-display area NDA1. Some scan lines SLb arranged sufficiently far from the first region R1 and the second region R2 in the first non-display area NDA1 or scan lines that do not traverse the first non-display area NDA1 may each extend in a substantially straight line.

Some data lines DLa may each extend substantially in the second direction (y direction) to provide signals to the pixels P arranged on opposite sides (e.g., the upper and lower sides) of the first non-display area NDA1, but may bypass (or detour around) the first region R1 and the second region R2 in the first non-display area NDA1. Some data lines DLb arranged between the first region R1 and the second region R2 in the first non-display area NDA1 or data lines that do not traverse the first non-display area NDA1 may each extend in a substantially straight line.

For example, when the first region R1 and the second region R2 have circular shapes, signal lines positioned close to the first region R1 and the second region R2 may curve along the first region R1 and the second region R2, and signal lines positioned far from the first region R1 and the second region R2 may each extend in a straight line.

The dummy pixels Pd positioned in the first non-display area NDA1 may include no light emitting elements and may emit no light even when they receive electrical signals from signal lines.

The dummy pixels Pd may be included to secure uniformity of a pattern density and uniformity of an electrical load. If no dummy pixels Pd are arranged in the first non-display area NDA1 and if only signal lines SLa, SLb, DLa, and DLb (connecting pixels P in the display area DA to each other) are arranged in the first non-display area NDA1, a pattern density is low in the first non-display area NDA1; as a result, a non-uniform pattern may be undesirably formed during etching.

Moreover, if no dummy pixels Pd are arranged in the first non-display area NDA1, a parasitic capacitance or a different load in the first non-display area NDA1 and its surroundings may be substantially different from that in a center portion of the display area DA. Accordingly, brightness of a displayed image may be undesirably non-uniform.

According to an embodiment, the first non-display area NDA1 includes a dummy pixel circuit PC' having substantially the same structure as a pixel circuit PC (see FIG. 7A) included in each pixel P, and an electrical signal is applied to the dummy pixel circuit PC'; thus, uniformity of a pattern density and uniformity of an electrical load may be both secured.

Dummy pixels Pd may be positioned in the first non-display area NDA1 between the first region R1 and the second region P2.

As shown in FIG. 5B, dummy pixels Pd may surround the first region R1 and/or the second region R2. Dummy pixels Pd may be between the first region R1 and the second region R2 and may be on the left, upper, and lower sides of the first region R1 and close to the display area DA. Dummy pixels Pd may be on the right, upper, and lower sides of the second region R2 and close to the display area DA.

Dummy pixels Pd may be arranged between pixels P and the first region R1 and/or between pixels P and the second region R2. The dummy pixels Pd may protect the pixels P (in the display area DA) from electrostatic discharge (ESD) that may occur around the first region R1 and/or the second region R2. The dummy pixels Pd may serve as a buffer to prevent a large voltage caused by ESD from being transmitted to the pixels P.

FIGS. 6A to 6D each illustrate a schematic cross-sectional view of a pixel P and a dummy pixel Pd taken along lines C-C' and B-B' of FIG. 5A or FIG. 5B according to an embodiment.

Figure 6A:
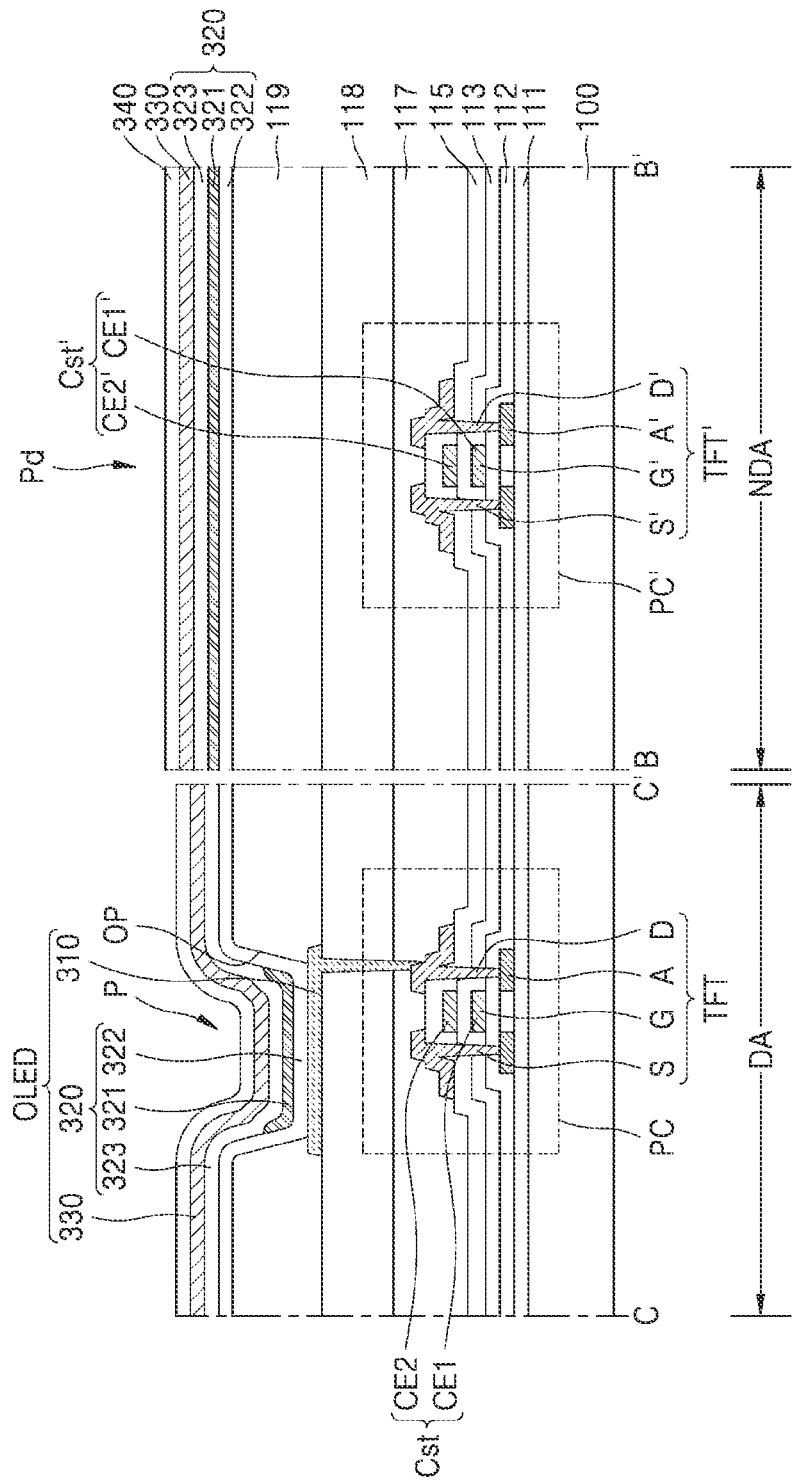
FIG. 6A, FIG. 6B, FIG. 6C, and FIG. 6D each illustrate a cross-sectional view of a pixel and a dummy pixel according to an embodiment.

Referring to FIG. 6A, the pixel P may include a pixel circuit PC including at least one thin-film transistor TFT and may include an organic light-emitting diode OLED as a display element. The dummy pixel Pd may include a dummy pixel circuit PC' including at least one dummy thin-film transistor TFT'. The pixel circuit PC and the dummy pixel circuit PC' may have the same structure.

In the dummy pixel Pd, some components of a display element are removed or not provided such that light is not emitted even when an electrical signal is applied to the dummy pixel circuit PC'.

Compared with the pixel P, no pixel electrode 310 is arranged in the dummy pixel Pd, and thus light is not emitted. The dummy pixel Pd may not include an opposite electrode 330 of the organic light-emitting diode OLED. Various modifications may be made.

Although a single thin-film transistor TFT is included in the pixel circuit PC and a single thin-film transistor TFT' is included in the dummy pixel circuit PC' in FIG. 6A, a plurality of (e.g., two to seven) thin-film transistors TFT and a plurality of (e.g., two to seven) thin-film transistors TFT' may be included. Various modifications may be made.

The substrate 100 may include a glass material, a metal material, or a material that is flexible or bendable. When the substrate 100 is flexible or bendable, the substrate 100 may include a polymer resin, such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The substrate 100 may have a structure of a single layer or multiple layers. The multi-layered structure may include an inorganic layer. In some embodiments, the substrate 100 may have a structure of stacked organic material, inorganic material, and organic material.

A buffer layer 111 may be positioned on the substrate 100 and may reduce or prevent infiltration of a foreign material, moisture, or ambient air from the substrate 100 to the circuits PC and PC' and may provide a flat surface on the substrate 100. The buffer layer 111 may include an inorganic material (such as oxide or nitride), an organic material, or an organic and inorganic composite/combination, and may be include a single layer or multiple layers of an inorganic material and an organic material.

A barrier layer (not shown) may be further included between the substrate 100 and the buffer layer 111. The barrier layer may prevent or minimize infiltration of impurities from the substrate 100 and the like into semiconductor layers A and A'. The barrier layer may include an inorganic material (such as oxide or nitride), an organic material, or an organic and inorganic combination/composite, and may be formed as a single layer or multiple layers of an inorganic material and an organic material.

The semiconductor layers A and A' may be arranged on the buffer layer 111. The semiconductor layers A and A' may include amorphous silicon or polysilicon. According to an embodiment, the semiconductor layers A and A' may include oxide of at least one selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the semiconductor layers A and A' may be formed of Zn oxide, In—Zn oxide, Ga—In—Zn oxide, or the like as a Zn oxide-based material. In embodiments, the semiconductor layers A and A' may be an In—Ga—Zn—O (IGZO), In—Sn—Zn—O (ITZO), or In—Ga—Sn—Zn—O (IGTZO) semiconductor containing a metal, such as In, Ga, or Sn, in ZnO. The semiconductor layers A and A' each may include a channel region, and a source region and a drain region respectively arranged on two sides of the channel region. Each of the semiconductor layers A and A' may be a single layer or multiple layers.

Gate electrodes G and G' are arranged on the semiconductor layers A and A' with an intervening first gate insulating layer 112; the gate electrodes G and G' at least partially overlap the semiconductor layers A and A'. The gate electrodes G and G' may include, for example, molybdenum (Mo), aluminum (Al), copper (Cu), or titanium (Ti), and each may include a single layer or multiple layers. For example, each of the gate electrodes G and G' may include a single layer of Mo.

The first gate insulating layer 112 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

A second gate insulating layer 113 may cover the gate electrodes G and G'. The second gate insulating layer 113 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

First storage capacitor plates CE1 and CE1' of storage capacitors Cst and Cst' may overlap the thin-film transistors TFT and TFT'. The gate electrodes G and G' of the thin-film transistors TFT and TFT' may function as the first storage capacitor plates CE1 and CE1' of the storage capacitors Cst and Cst'.

Second storage capacitor plates CE2 and CE2' of the storage capacitors Cst and Cst' overlap the first storage capacitor plates CE1 and CE1' with the intervening second gate insulating layer 113. The second gate insulating layer 113 may function as dielectric layers of the storage capacitors Cst and Cst'. The second storage capacitor plates CE2 and CE2' may include a conductive material including molybdenum (Mo), aluminum (Al), copper (Cu), and titanium (Ti), and each may be a multi-layer or single layer. For example, the second storage capacitor plates CE2 and CE2' may each include a single layer of Mo or a multi-layer structure of Mo—Al—Mo.

The storage capacitors Cst and Cst' overlap the thin-film transistors TFT and TFT' in FIGS. 6A to 6D. In an embodiment, the storage capacitors Cst and Cst' may not overlap the thin-film transistors TFT and TFT'.

An interlayer insulating layer 115 may cover the second storage capacitor plates CE2 and CE2' of the storage capacitors Cst and Cst'. The interlayer insulating layer 115 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

Source electrodes S and S' and drain electrodes D and D' may be arranged on the interlayer insulating layer 115. Each of the source electrode S and S' and the drain electrodes D and D' may include a conductive material including Mo, Al, Cu, and Ti, and may be a multi-layer structure or single layer. For example, each of the source electrodes S and S' and the drain electrodes D and D' may be a multi-layer structure of Ti—Al—Ti.

A via layer 117 and an additional via layer 118 may be positioned on the source electrodes S and S' and the drain electrodes D and D', and the organic light-emitting diode OLED may be positioned in a region of the pixel P on the additional via layer 118. In some embodiments, the additional via layer 118 may be unnecessary.

The via layer 117 and the additional via layer 118 may have flat upper surfaces such that the pixel electrode 310 may be sufficiently flat. The via layer 117 and the additional via layer 118 may each be a single layer including an organic material or multiple layers including an organic material. The via layer 117 and the additional via layer 118 may include a polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The via layer 117 and the additional via layer 118 may include an inorganic material. The via layer 117 and the additional via layer 118 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. When the via layer 117 and the additional via layer 118 include an inorganic material, chemical planarization polishing may be conducted. The via layer 117 may include both an organic material and an inorganic material.

On the display area DA of the substrate 100, the organic light-emitting diode OLED is positioned on the additional via layer 118. The organic light-emitting diode OLED includes the pixel electrode 310, the opposite electrode 330, and an intermediate layer 320 including an organic emission layer.

A via hole via is positioned in the via layer 117 and the additional via layer 118 and may expose one of the source electrode S and the drain electrode D of the thin-film transistor TFT, and the pixel electrode 310 contacts the source electrode S or the drain electrode D via the via hole and is electrically connected to the thin-film transistor TFT.

The pixel electrode 310 may be a transparent electrode, a semi-light-transmissive electrode, or a reflective electrode. The pixel electrode 310 may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), or a combination/alloy, and may include a transparent or semi-transparent electrode layer formed on the reflection layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 310 may have a stack structure of ITO-Ag-ITO.

A pixel defining layer 119 may be disposed on the additional via layer 118. The pixel defining layer 119 may define light-emission regions of pixels P at openings OP respectively corresponding to the pixel electrodes 310. The openings OP may expose at least center portions of the pixel electrodes 310. The pixel defining layer 119 may prevent an electric arc from occurring on the edges of the pixel electrodes 310 by increasing distances between the edges of the pixel electrodes 310 and the opposite electrodes 330. The pixel defining layer 119 may be formed of an organic insulating material, such as polyimide, polyamide, acryl resin, benzocyclobutene, hexamethyldisiloxane (HMDSO), or phenol resin, via spin coating or the like.

The light-emission regions of the pixels P may be defined by the openings OP of the pixel defining layer 119. Edges of the pixels P may correspond to edges of the openings OP of the pixel defining layer 119. The edges of the openings OP of the pixel defining layer 119 may correspond to boundaries of portions of the pixel electrodes 310 that are exposed via the openings OP.

The intermediate layer 320 of the organic light-emitting diode OLED may include an organic emission layer 321, and a first common layer 322 and a second common layer 323 that may be respectively disposed on opposite faces (e.g., the bottom and top) of the organic emission layer 321.

The organic emission layer 321 may include an organic material including a fluorescent or phosphorescent material that may emit red, green, blue, or white light. The organic emission layer 321 may include a low-molecular weight organic material or a high-molecular weight organic material.

The first common layer 322 may include a hole injection layer (HIL) and/or a hole transport layer (HTL), and the second common layer 323 may include an electron transport layer (ETL) and/or an electron injection layer (EIL).

An intermediate layer 320 may correspond to each of a pixel electrode 310. The first common layer 322 and/or the second common layer 323 may extend over pixel electrodes 310. The first common layer 322 and/or the second common layer 323 may be unnecessary.

The opposite electrode 330 may include a light-transmissive electrode or a reflective electrode. According to some embodiment, the opposite electrode 330 may include a transparent or semi-transparent electrode, and may include a metal thin film having a small/low work function, including lithium (Li), calcium (Ca), lithium fluoride/calcium (LiF/Ca), lithium fluoride/aluminum (LiF/Al), aluminum (Al), silver (Ag), magnesium (Mg), or a combination/alloy. A transparent conductive oxide (TCO) layer including TCO, such as indium tin oxide (ITO), indium zinc oxide (IZO), zinc oxide (ZnO), or indium oxide ($In_2O_3$), may be disposed on the metal thin film. The opposite electrode 330 may extend over both the display area DA and the non-display area NDA and may be arranged on the intermediate layer 320 and the pixel defining layer 119. Portions of the opposite electrode 330 may be parts of a plurality of organic light-emitting diodes OLED and may correspond to a plurality of pixel electrodes 310.

When the pixel electrode 310 includes a reflective electrode and the opposite electrode 330 includes a light-transmissive electrode, light emitted by the intermediate layer 320 is emitted toward the opposite electrode 330, and the display device 1 may be of a top-emission type. When the pixel electrode 310 includes a transparent or semi-transparent electrode and the opposite electrode 330 includes a reflective electrode, light emitted by the intermediate layer 320 is emitted toward the substrate 100, and the display device 1 may be of a bottom-emission type. The display device 1 may emit light toward both the top surface and the bottom surface of the display device 1.

A dummy pixel Pd arranged in the first non-display area NDA1 of the substrate 100 may include no pixel electrode, and the pixel defining layer 119 may not include an opening corresponding to the dummy pixel Pd. The pixel defining layer 119 may have a flat upper surface at the dummy pixel Pd. The pixel defining layer 119 may be formed of an organic material (via exposure and curing) and may not affect non-uniformity or pattern density.

At the dummy pixel Pd, the intermediate layer 320 may be positioned on the pixel defining layer 119. Even when the intermediate layer 320 is arranged in the region of the dummy pixel Pd, the dummy pixel Pd includes no pixel electrodes, and thus no light is emitted by the intermediate layer 320.

In FIG. 6A, the organic emission layer 321, the first common layer 322, and the second common layer 323 are all arranged in the region of the dummy pixel Pd, like the intermediate layer 320 arranged in the pixel P.

Figure 6B:
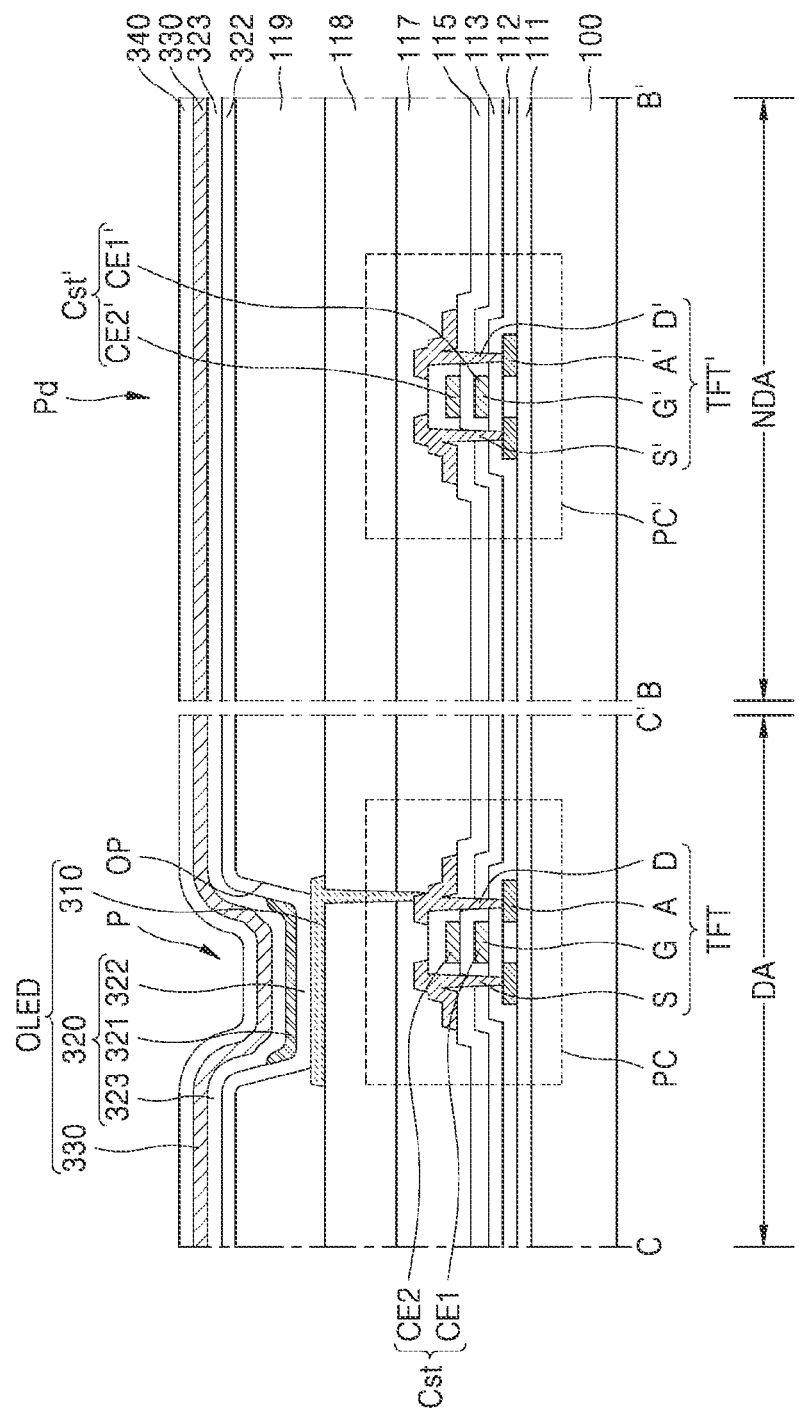

In FIG. 6B, the organic emission layer 321, the first common layer 322, and the second common layer 323 may be arranged at the pixel P; at the dummy pixel Pd, no organic emission layers 321 may be arranged, and only the first common layer 322 and the second common layer 323 may be arranged. The common layers 322 and 323 may directly contact each other at the dummy pixel Pd.

Figure 6C:
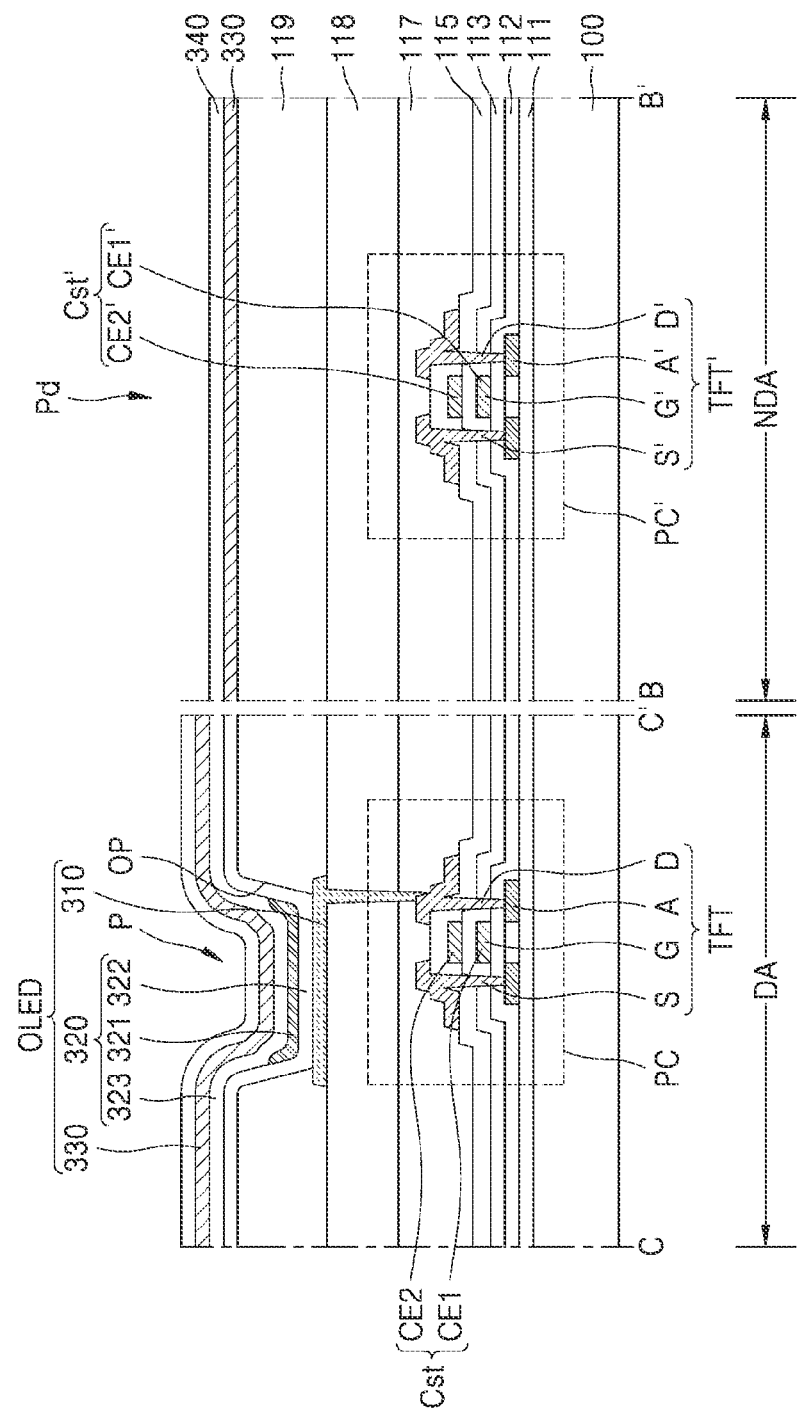

In FIG. 6C, the intermediate layer 320 may be arranged at the pixel P, and no intermediate layers 320 may be arranged at the dummy pixel Pd. The opposite electrodes 330 may directly contact an upper surface of the pixel defining layer 119 at the dummy pixel Pd.

Figure 6D:
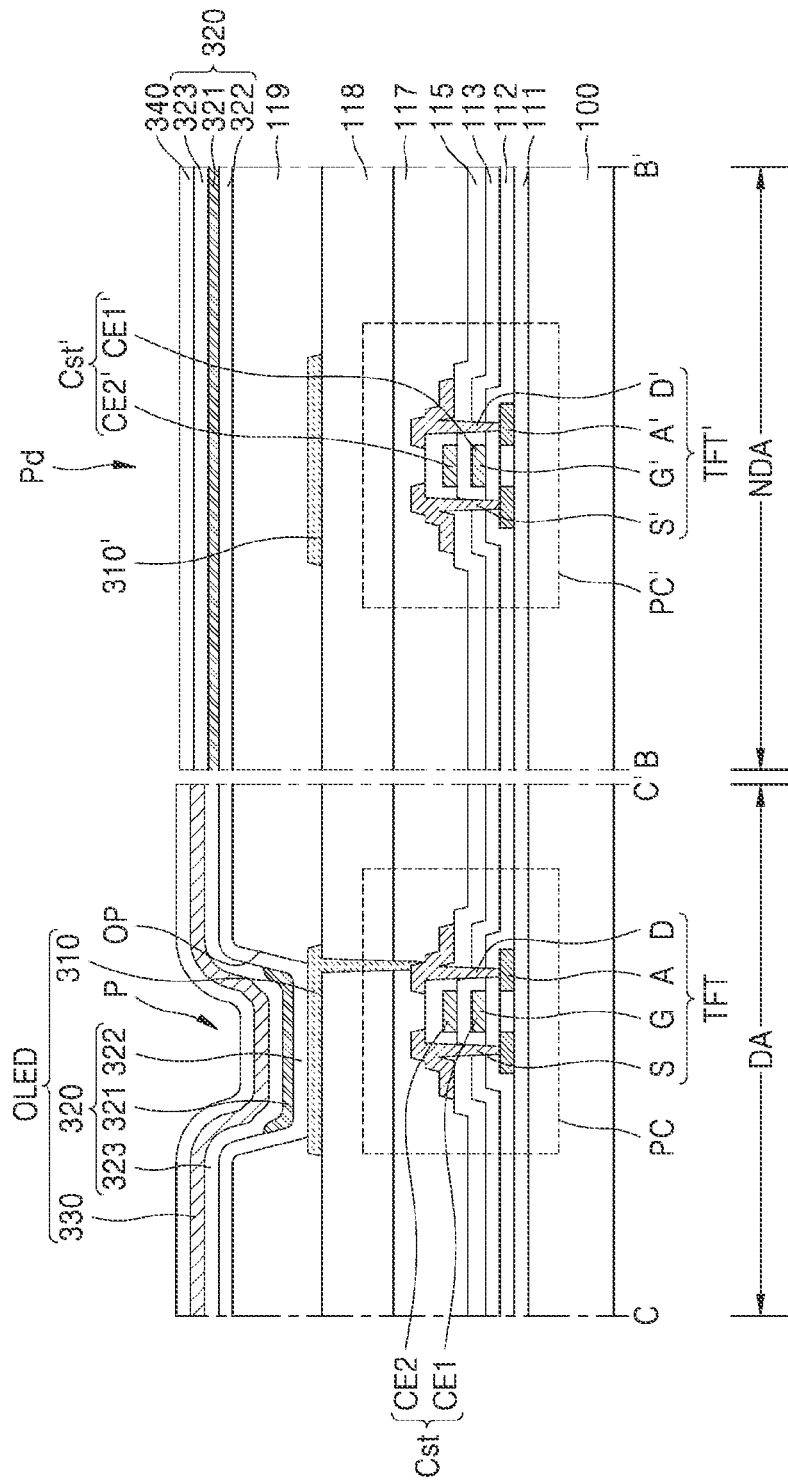

In FIG. 6D, the opposite electrode 330 may not be arranged in the dummy pixel Pd. A the dummy pixel Pd, a conductive layer 310' including the same material as that included in the pixel electrode 310 and positioned on the same layer on which the pixel electrode 310 is formed. The organic emission layer 321, the first common layer 322, and the second common layer 323 of the intermediate layer 320 may be arranged in the dummy pixel Pd. At least one of the conductive layer 310', the organic emission layer 321, the first common layer 322, and the second common layer 323 may not be formed at the dummy pixel Pd.

Because the opposite electrode 330 is formed over the entire display panel using an open mask, the opposite electrode 330 may correspond to the pixel P and the dummy pixel Pd.

A capping layer 340 may be arranged on the opposite electrode 330. The capping layer 340 may have a different (lower or higher) refractive index than the opposite electrode 330 and may improve luminescent efficiency by increasing a percentage that light generated by the intermediate layer 320 is totally reflected and is emitted outside the display panel 10.

The capping layer 340 may include an organic material, such as at least one of poly(3,4-ethylenedioxythiophene) (or PEDOT), 4,4'-bis [N-(3-methylphenyl)-N-phenylamino]biphenyl (TPD), 4,4',4"-tris [(3-methylphenyl) phenylamino] triphenylamine (m-MTDATA), 1,3,5-tris [N,N-bis(2-methylphenyl)-amino]-benzene (o-MTDAB), 1,3,5-tris [N,N-bis (3-methylphenyl)-amino]-benzene (m-MTDAT), 1,3,5-tris [N,N-bis (4-methylphenyl)-amino]-benzene (p-MTDAB), 4,4'-bis [N,N-bis(3-methylphenyl)-amino]-diphenylmethane (BPPM), 4,4'-dicarbazolyl-1,1'-biphenyl (CBP), 4,4',4"-tris (N-carbazole) triphenylamine (TCTA), 2,2',2"-(1,3,5-benzenetolyl) tris-[1-phenyl-1H-benzoimidazole] (TPBI), and 3-(4-biphenyl)-4-phenyl-5-t-butylphenyl-1,2,4-triazole (TAZ).

The capping layer 340 may include an inorganic material, such as at least one of zinc oxide, titanium oxide, zirconium oxide, silicon nitride, niobium oxide, tantalum oxide, tin oxide, nickel oxide, indium nitride, and gallium nitride.

A cover layer (not shown) may be arranged on the capping layer 340. The cover layer protects the organic light-emitting diode OLED against damage that may occur during a subsequent process using plasma or the like. The cover layer may include LiF.

Figure 7A:
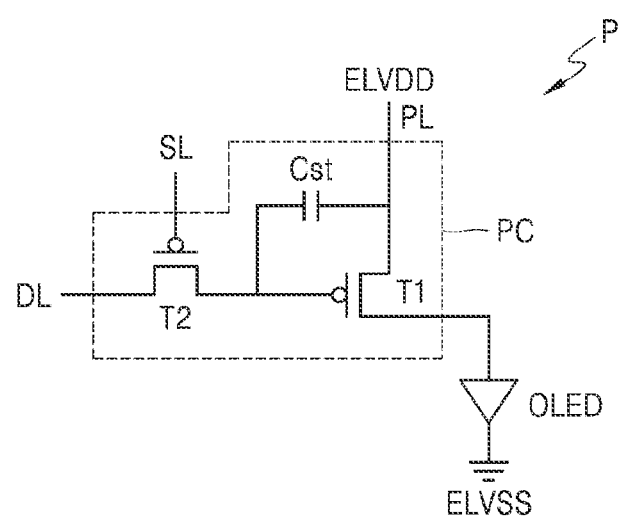
FIG. 7A and FIG. 7B each illustrate an equivalent circuit diagram of a pixel according to an embodiment.
Figure 7B:
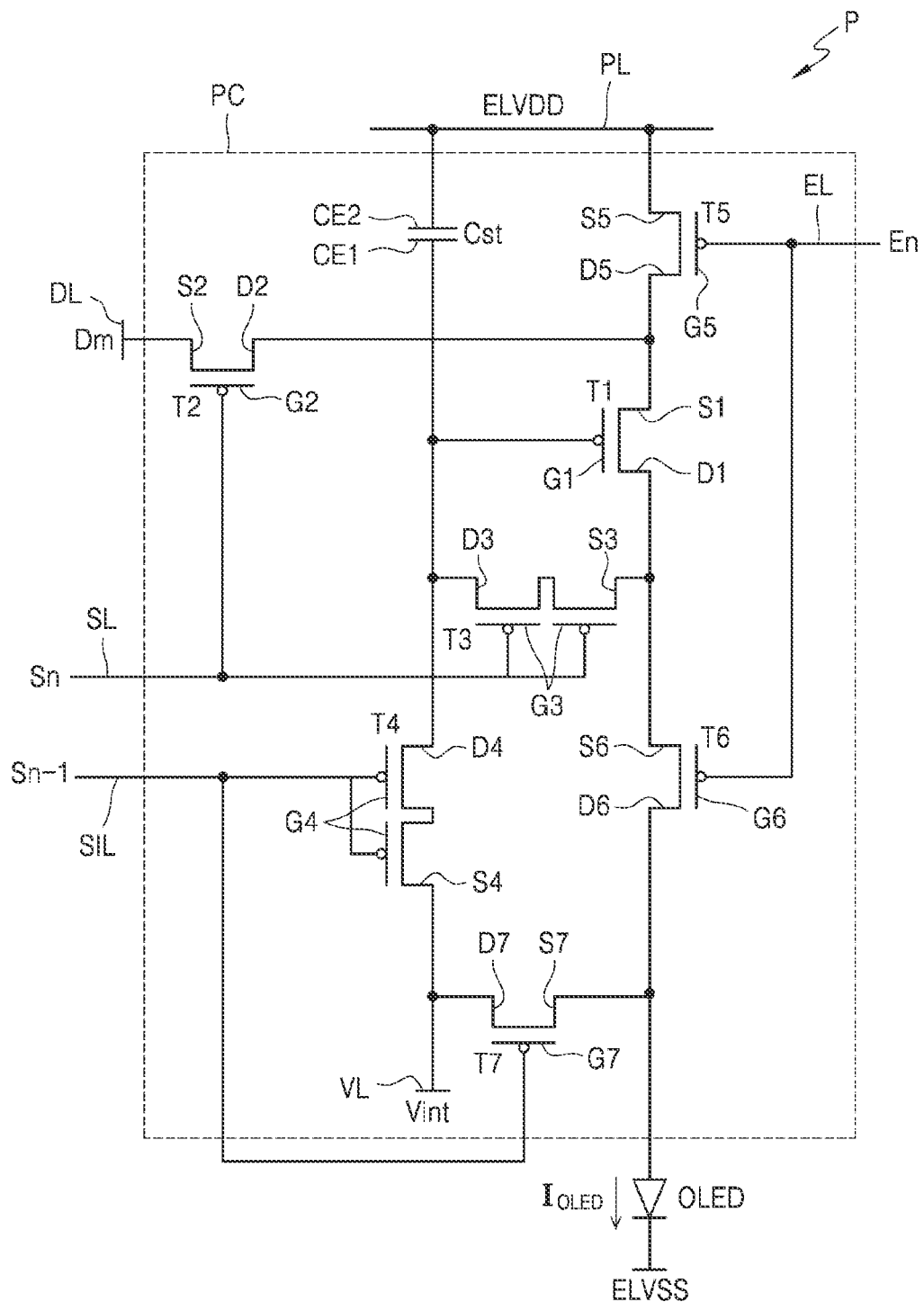

FIGS. 7A and 7B are schematic equivalent circuit diagrams of a pixel P of a display panel according to embodiments.

Referring to FIG. 7A, each pixel P includes a pixel circuit PC and an organic light-emitting diode OLED connected to the pixel circuit PC. The pixel circuit PC may include a driving thin-film transistor (TFT) T1, a switching TFT T2, and a storage capacitor Cst.

The switching TFT T2 is connected to a scan line SL and a data line DL, and transmits, to the driving TFT T1, a data voltage received via the data line DL according to a switching voltage received via the scan line SL. The storage capacitor Cst is connected to the switching TFT T2 and a driving voltage line PL, and stores a voltage corresponding to a difference between a voltage received from the switching TFT T2 and a driving voltage ELVDD supplied to the driving voltage line PL.

The driving TFT T1 is connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light having a certain brightness according to the driving current. An opposite electrode (for example, a cathode) of the organic light-emitting diode OLED may receive a common voltage ELVSS.

Although a case where the pixel circuit PC includes two TFTs and one storage capacitor is illustrated in FIG. 7A, the disclosure is not limited thereto. The number of TFTs and the number of storage capacitors may vary according to a design of the pixel circuit PC.

Referring to FIG. 7B, the pixel circuit PC may include a plurality of TFTs and a storage capacitor Cst. The TFTs and the storage capacitor may be connected to signal lines SL, SIL, EL, and DL, an initializing voltage line VL, and a driving voltage line PL.

Although each pixel P is connected to the signal lines SL, SIL, EL, and DL, the initializing voltage line VL, and the driving voltage line PL in FIG. 7B, the disclosure is not limited thereto. According to another embodiment, the initializing voltage line VL, the driving voltage line PL, and at least one of the signal lines SL, SIL, EL, and DL may be shared by neighboring pixels.

The plurality of TFTs may include a driving TFT T1, a switching TFT T2, a compensating TFT T3, a first initializing TFT T4, an operation control TFT T5, a light-emission control TFT T6, and a second initializing TFT T7.

The signal lines SL, SIL, EL, and DL may include a scan line SL that transmits a scan signal SL, a previous scan line SIL that transmits a previous scan signal SIL to the second initializing TFT T7, a light-emission control line EL that transmits a light-emission control signal En to the operation control TFT T5 and the light-emission control TFT T6, and a data line DL that intersects with the scan line SL and transmits a data signal Dm. The driving voltage line PL transmits a driving voltage ELVDD to the driving TFT T1, and the initializing voltage line VL transmits an initializing voltage Vint that initiates the driving TFT T1 and a pixel electrode of the organic light-emitting diode OLED.

The driving TFT T1 includes a driving gate electrode G1 connected to a first storage capacitor plate CE1 of the storage capacitor Cst, a driving source electrode S1 connected to the driving voltage line PL via the operation control TFT T5, and a driving drain electrode D1 electrically connected to the pixel electrode of the organic light-emitting diode OLED via the light-emission control TFT T6. The driving TFT T1 receives the data signal Dm according to a switching operation of the switching TFT T2 and supplies a driving current $I_{OLED}$ to the organic light-emitting diode OLED.

The switching TFT T2 includes a switching gate electrode G2 connected to the scan line SL, a switching source electrode S2 connected to the data line DL, and a switching drain electrode D2 connected to the driving source electrode S1 of the driving TFT T1 and also connected to the driving voltage line PL via the operation control TFT T5. The switching TFT T2 is turned on according to the scan signal GW received via the scan line SL and performs a switching operation of transmitting the data signal Dm received from the data line DL to the driving source electrode S1 of the driving TFT T1.

The compensating TFT T3 includes a compensating gate electrode G3 connected to the scan line SL, a compensating source electrode S3 connected to the driving drain electrode D1 of the driving TFT T1 and also connected to the pixel electrode of the organic light-emitting diode OLED via the light-emission control TFT T6, and a compensating drain electrode D3 connected to the first storage capacitor plate CE1 of the storage capacitor Cst, a first initializing drain electrode D4 of the first initializing TFT T4, and the driving gate electrode G1 of the driving TFT T1. The compensating TFT T3 is turned on according to the scan signal GW received via the scan line SL and electrically connects the driving gate electrode S1 and the driving drain electrode D1 of the driving TFT T1 to each other, such that the driving TFT T1 is diode-connected.

The first initializing TFT T4 includes a first initializing gate electrode G4 connected to the previous scan line SIL, a first initializing source electrode S4 connected to a second initializing drain electrode D7 of the second initializing TFT T7 and the initializing voltage line VL, and the first initializing drain electrode D4 connected to the first storage capacitor plate CE1 of the storage capacitor Cst, the compensating drain electrode D3 of the compensating TFT T3, and the driving gate electrode G1 of the driving TFT T1. The first initializing TFT T4 is turned on according to the previous scan signal SI received via the previous scan line SIL and transmits the initializing voltage Vint to the driving gate electrode G1 of the driving TFT T1 to thereby initialize a voltage of the driving gate electrode G1 of the driving TFT T1.

The operation control TFT T5 includes an operation control gate electrode G5 connected to the light-emission control line EL, an operation control source electrode S5 connected to the driving voltage line PL, and an operation control drain electrode D5 connected to the driving source electrode S1 of the driving TFT T1 and the switching drain electrode D2 of the switching TFT T2.

The light-emission control TFT T6 includes a light-emission control gate electrode G6 connected to the light-emission control line EL, a light-emission control source electrode S6 connected to the driving drain electrode D1 of the driving TFT T1 and the compensating source electrode S3 of the compensating TFT T3, and a light-emission control drain electrode D6 electrically connected to a second initializing source electrode S7 of the second initializing TFT T7 and the pixel electrode of the organic light-emitting diode OLED.

The operation control TFT T5 and the light-emission control TFT T6 are simultaneously turned on according to the light-emission control signal EM received via the light-emission control line EL, and thus the driving voltage ELVDD is transmitted to the organic light-emitting diode OLED such that the driving current $I_{OLED}$ may flow in the organic light-emitting diode OLED.

The second initializing TFT T7 includes a second initializing gate electrode G7 connected to the previous scan line SIL, the second initializing source electrode S7 connected to the light-emission control drain electrode D6 of the light-emission control TFT T6 and the pixel electrode of the organic light-emitting diode OLED, and the second initializing drain electrode D7 connected to the first initializing source electrode S4 of the first initializing TFT T4 and the initializing voltage line VL. The second initializing TFT T7 is turned on according to the previous scan signal Sn-1 received via the previous scan line SIL and initializes the pixel electrode of the organic light-emitting diode OLED.

Although the first initializing TFT T4 and the second initializing TFT T7 are connected to the previous scan line SIL in FIG. 7B, the disclosure is not limited thereto. According to another embodiment, the first initializing TFT T4 may be connected to the previous scan line SIL and operate according to the previous scan signal Sn-1, and the second initializing TFT T7 may be connected to a separate signal line (for example, a subsequent scan line) and operate according to a signal transmitted to the separate signal line.

A second storage capacitor plate CE2 of the storage capacitor Cst is connected to the driving voltage line PL, and an opposite electrode of the organic light-emitting diode OLED is connected to a common voltage ELVSS. Accordingly, the organic light-emitting diode OLED may receive the driving current $I_{OLED}$ from the driving TFT T1 and emit light, thereby displaying an image.

Although each of the compensating TFT T3 and the first initializing TFT T4 has a dual gate electrode in FIG. 7B, each of the compensating TFT T3 and the first initializing TFT T4 may have a single gate electrode.

The pixel circuit PC included in the pixel P illustrated in FIGS. 7A and 7B is applicable to the dummy pixel circuit PC' included in the dummy pixel Pd.

Figure 8:
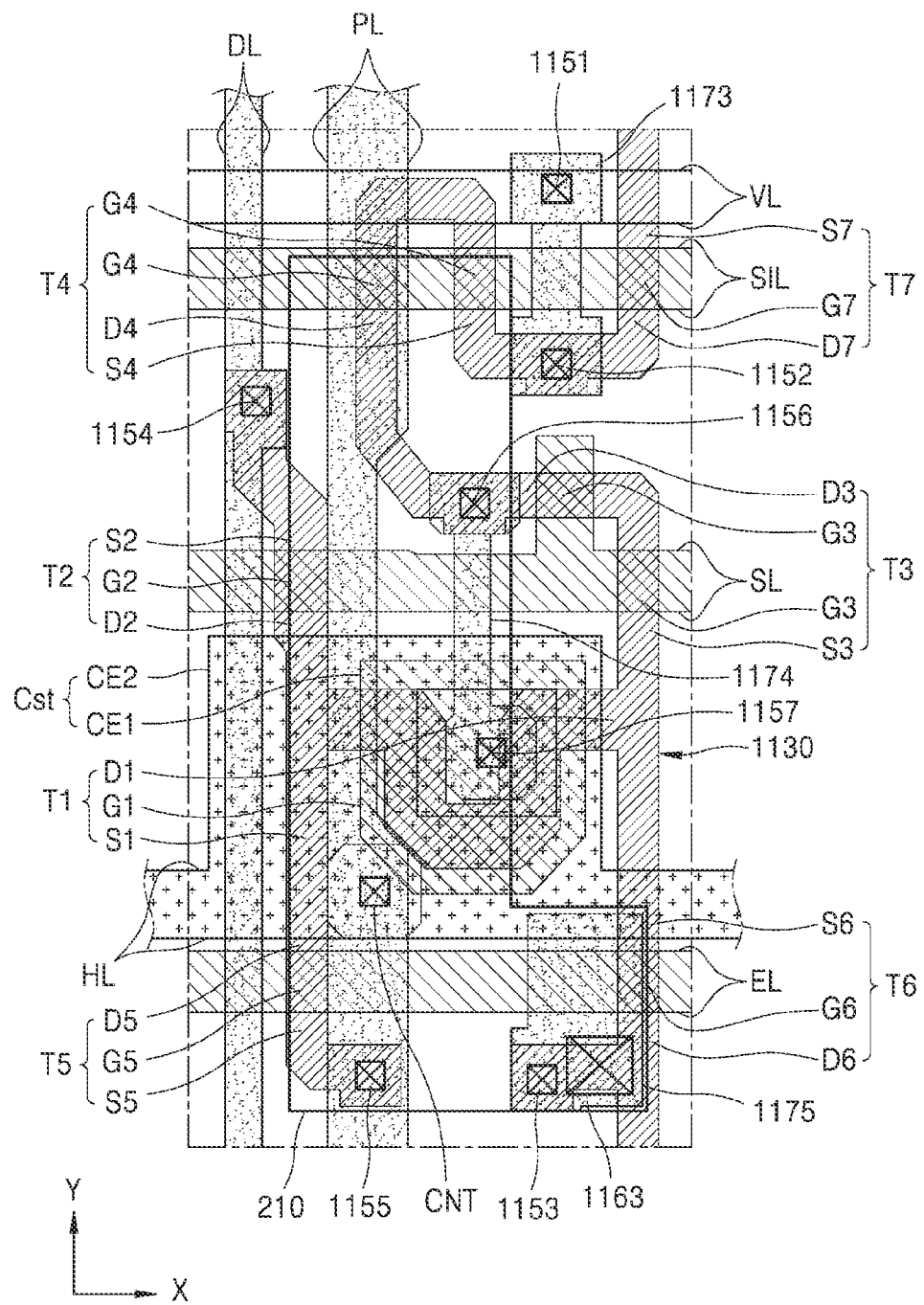
FIG. 8 is a plan view of a pixel circuit according to an embodiment.

FIG. 8 is a plan view of a pixel circuit applicable to a display panel according to an embodiment. According to the present embodiments, a dummy pixel circuit may be the same as the pixel circuit. Thus, FIG. 8 may be a plan view of a dummy pixel circuit applicable to a display panel according to an embodiment.

Referring to FIG. 8, the driving TFT T1, the switching TFT T2, the compensating TFT T3, the first initializing TFT T4, the operation control TFT T5, the light-emission control TFT T6, and the second initializing TFT T7 are arranged along a semiconductor layer 1130. The semiconductor layer 1130 may be arranged on a substrate on which a buffer layer including an inorganic insulating material is arranged.

Some regions of the semiconductor layer 1130 correspond to semiconductor layers of the driving TFT T1, the switching TFT T2, the compensating TFT T3, the first initializing TFT T4, the operation control TFT T5, the light-emission control TFT T6, and the second initializing TFT T7. In other words, it may be understood that the semiconductor layers of the driving TFT T1, the switching TFT T2, the compensating TFT T3, the first initializing TFT T4, the operation control TFT T5, the light-emission control TFT T6, and the second initializing TFT T7 are connected to each other and bent in various shapes.

The semiconductor layer 1130 includes a channel region, and a source region and a drain region on two opposite sides of the channel region. The source region and the drain region may be understood as a source electrode and a drain electrode of the relevant TFT. Hereinafter, for convenience of description, the source region and the drain region are respectively called a source electrode and a drain electrode.

The driving TFT T1 includes the driving gate electrode G1 that overlaps a driving channel region, and the driving source electrode S1 and the driving drain electrode D1 on two opposite sides of the driving channel region. The driving channel region that overlaps the driving gate electrode G1 may form a long channel within a narrow space by having a bent shape such as an omega shape. When the driving channel region is long, a driving range of a gate voltage is widened, and accordingly a gray scale of light emitted from the organic light-emitting diode OLED may be more elaborately controlled and display quality may be improved.

The switching TFT T2 includes the switching gate electrode G2 that overlaps a switching channel region, and the switching source electrode S2 and the switching drain electrode D2 on two opposite sides of the switching channel region. The switching drain electrode D2 may be connected to the driving source electrode S1.

The compensating TFT T3 is a dual TFT, and thus may include compensating gate electrodes G3 that respectively overlap two compensating channel regions, and include the compensating source electrode S3 and the compensating drain electrode D3 arranged on two opposite sides of the compensating channel regions. The compensating TFT T3 may be connected to the driving gate electrode G1 of the driving TFT T1 through a node connection line 1174 which will be described later.

The first initializing TFT T4 is a dual TFT, and thus may include first initializing gate electrodes G4 that respectively overlap two first initializing channel regions and include the first initializing source electrode S4 and the first initializing drain electrode D4 arranged on two opposite sides of the first initializing channel regions.

The operation control TFT T5 may include the operation control gate electrode G5 that overlaps an operation control channel region, and the operation control source electrode S5 and the operation control drain electrode D5 arranged on two opposite sides of the operation control channel region. The operation control drain electrode D5 may be connected to the driving source electrode S1.

The light-emission control TFT T6 may include the light-emission control gate electrode G6 that overlaps a light-emission control channel region, and the light-emission control source electrode S6 and the light-emission control drain electrode D6 arranged on two opposite sides of the light-emission control channel region. The light-emission control source electrode S6 may be connected to the driving drain electrode D1.

The second initializing TFT T7 may include the second initializing gate electrode G7 that overlaps a second initializing channel region, and the second initializing source electrode S7 and the second initializing drain electrode D7 arranged on two opposite sides of the second initializing channel region.

The aforementioned TFTs may be connected to the signal lines SL, SIL, EL, and DL, the initializing voltage line VL, and the driving voltage line PL.

The scan line SL, the previous scan line SIL, the light-emission control line EL, and the driving gate electrode G1 may be arranged on the semiconductor layer 1130 with one or more intervening insulating layers.

The scan line SL may extend in the first direction. Some regions of the scan line SL may correspond to the switching and compensating gate electrodes G4 and G7. For example, regions of the scan line SL that overlap the respective channel regions of the initializing TFTs T4 and T7 may be the initializing gate electrodes G4 and G7, respectively.

The previous scan line SIL may extend in the first direction, and some regions thereof may respectively correspond to the initializing gate electrodes G4 and G7. For example, regions of the previous scan line SIL that overlap the respective channel regions of the initializing TFTs T4 and T7 may be the initializing gate electrodes G4 and G7, respectively.

The light-emission control line EL may extend in the first direction. Some regions of the light-emission control line EL may correspond to the operation control and light-emission control gate electrodes G5 and G6, respectively. For example, regions of the light-emission control line EL that overlap the respective channel regions of the operation control and light-emission control TFTs T6 and T7 may be the operation control and light-emission control gate electrodes G5 and G6, respectively.

The driving gate electrode G1 is a floating electrode, and thus may be electrically connected with the compensating TFT T3 through the above-described node connection line 1174.

An electrode voltage line HL may be arranged on the scan line SL, the previous scan line SIL, the light-emission control line EL, and the driving gate electrode G1 with one or more intervening insulating layers.

The electrode voltage line HL may extend in the first direction to intersect with the data line DL and the driving voltage line PL. A portion of the electrode voltage line HL may cover at least a portion of the driving gate electrode G1 and form the storage capacitor Cst together with the driving gate electrode G1. For example, the driving gate electrode G1 may serve as the first storage capacitor plate CE1 of the storage capacitor Cst, and a portion of the electrode voltage line HL may serve as the second storage capacitor plate CE2 of the storage capacitor Cst.

The second storage capacitor plate CE2 of the storage capacitor Cst is electrically connected to the driving voltage line PL. With regard to this, the electrode voltage line HL may be connected to the driving voltage line PL arranged on the electrode voltage line HL, through a contact hole CNT. Therefore, the electrode voltage line HL may have the same voltage level (constant voltage) as the driving voltage line PL. For example, the electrode voltage line HL may have a constant voltage of +5 V. The electrode voltage line HL may be understood as a driving voltage line extending in the first direction (X direction).

Because the driving voltage line PL extends in the second direction and the electrode voltage line HL electrically connected to the driving voltage line PL extends in the first direction that intersects with the second direction, a plurality of driving voltage lines PL and a plurality of electrode voltage lines HL may constitute a mesh structure in the display area DA.

The electrode voltage line HL may be arranged on a different layer than the layer on which the driving voltage line PL is arranged, and the electrode voltage line HL may have greater specific resistivity than the driving voltage line PL.

The data line DL, the driving voltage line PL, an initializing connection line 1173, and the node connection line 1174 may be arranged on the electrode voltage line HL with one or more intervening insulating layers.

The data line DL may extend in the second direction and may be connected to the switching source electrode S2 of the switching TFT T2 through a contact hole 1154. A portion of the data line DL may be understood as the switching source electrode S2.

The driving voltage line PL extends in the second direction and is connected to the electrode voltage line HL through the contact hole CNT as described above. The driving voltage line PL may also be connected to the operation control TFT T5 through a contact hole 1155. The driving voltage line PL may be connected to the operation control drain electrode D5 through the contact hole 1155.

One end of the initializing connection line 1173 may be connected to the initializing TFTs T4 and T7 through a contact hole 1152, and another end of the initializing connection line 1173 may be connected to the initializing voltage line VL, which will be described below, through a contact hole 1151.

One end of the node connection line 1174 may be connected to the compensating drain electrode D3 through a contact hole 1156, and another end of the node connection line 1174 may be connected to the driving gate electrode G1 through a contact hole 1157.

The initializing voltage line VL may be arranged on the data line DL, the driving voltage line PL, the initializing connection line 1173, and the node connection line 1174 with one or more intervening insulating layers.

The initializing voltage line VL extends in the first direction. The initializing voltage line VL may be connected to the initializing TFTs T4 and T7 through the initializing connection line 1173. The initializing voltage line VL may have a constant voltage (e.g. −2 V).

The initializing voltage line VL may be arranged on the same layer on which the second storage capacitor plate CE2, namely, the electrode voltage line HL, is arranged, and may include the same material as that included in the second storage capacitor plate CE2, namely, the electrode voltage line HL. In the display area DA, the pixel electrode of the organic light-emitting diode OLED may be connected to the light-emission control TFT T6. The pixel electrode may be connected to a connection metal 1175 through a contact hole 1163, and the connection metal 1175 may be connected to the light-emission control drain electrode D6 through a contact hole 1153.

Figure 9:
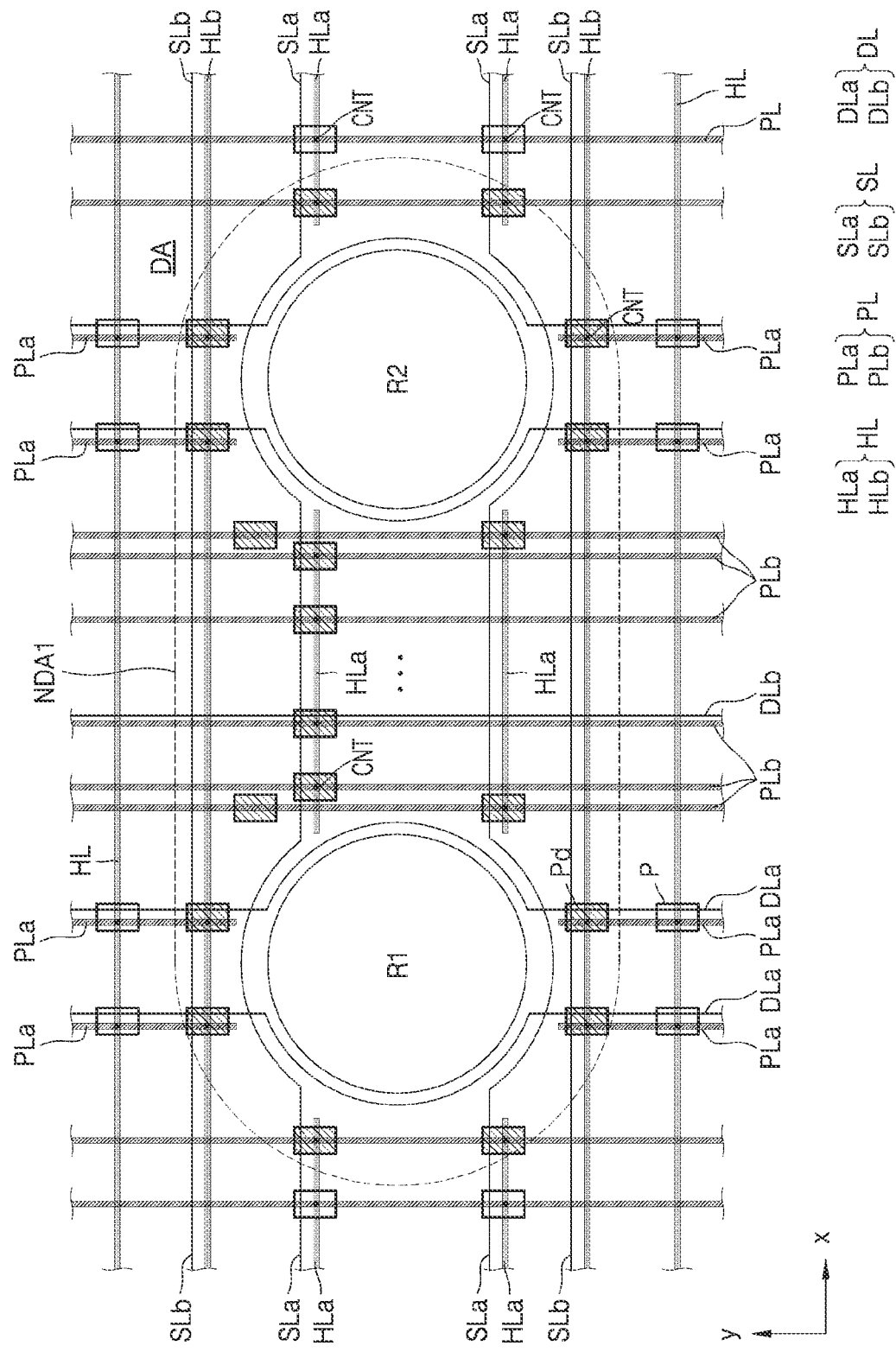
FIG. 9 is a plan view schematically illustrating an arrangement of some of the lines around a region of a display panel according to an embodiment.

FIG. 9 is a plan view schematically illustrating some of scan lines SL, data lines DL, driving voltage lines PL, and electrode voltage lines HL arranged around the first region R1. In FIG. 9, for clarity, some wires connected to pixels and dummy pixels are not shown.

Referring to FIG. 9, the scan lines SL may each extend substantially in the first direction, and the data lines DL may each extend substantially in the second direction and may intersect the scan lines SL.

In the first non-display area NDA1, some scan lines SLa may detour around the first region R1. For example, some scan lines SLa may curve along an upper edge of the first region R1, and others may curve along a lower edge of the first region R1. Dummy pixels Pd located on the left and right sides of the first region R1 may be electrically connected to the scan lines SLa detouring around the first region R1.

Scan lines SLb connected to dummy pixels Pd arranged on the upper and lower sides of the first region R1 in the first non-display area NDA1 may each extend in the first direction (x direction) in a straight line without curving along edges of the first region R1.

In the first non-display area NDA1, some data lines DLa may detour around the first region R1. For example, some data lines DLa may curve along a left edge of the first region R1, and others may curve along a right edge of the first region R1. Dummy pixels Pd located on the upper and lower sides of the first region R1 may be electrically connected to the data lines DLa detouring around the first region R1.

In the first non-display area NDA1, data lines DLb connected to dummy pixels Pd on the left side of the first region R1 and/or on the right side of the second region R2 or some dummy pixels Pd between the regions R1 and R2 may each extend in the second direction (y direction) in a straight line without curving along edges of the regions R1 and R2.

Driving voltage lines PLa and PLb may be arranged on the same layer on which the data lines DLa and DLb are arranged and may be spaced apart from the data lines DLa and DLb. The driving voltage lines PLa and PLb may each extend in the second direction such that the driving voltage lines PLa and PLb intersect with the scan lines SLa and SLb. Some driving voltage lines PLb from among the driving voltage lines PLa and PLb may each continuously extend to traverse the first non-display area NDA1, but driving voltage lines PLa around the first region R1 may be cut and/or may be discontinuous around the first region R1. Some driving voltage lines PLa may be arranged apart from each other and aligned each other with the first region R1 between the driving voltage lines. Likewise, some driving voltage lines PLa may be arranged apart from each other and aligned with each other with the second region R2 between the driving voltage lines PLa.

Electrode voltage lines HLa and HLb may each extend in the first direction and may intersect with the driving voltage lines PLa and PLb. Some electrode voltage lines HLb may each continuously extend to traverse the first non-display area NDA1, but some electrode voltage lines HLa may be cut and/or may be discontinuous around the regions R1 and R2. Some electrode voltage lines HLa may be arranged apart from each other and aligned with each other with the first region R1 between the electrode voltage lines HLa. Likewise, some electrode voltage lines HLa may be arranged apart from each other and aligned with each other with the second region R2 between the electrode voltage lines HLa.

The driving voltage lines PLa and PLb and the electrode voltage lines HLa and HLb may be electrically connected to dummy pixel circuits PC' through contact holes CNT. Between the regions R1 and R2, because driving voltage lines PLa and PLb intersect and are electrically connected to electrode voltage lines HLa and HLb, the driving voltage lines PLa and PLb and the electrode voltage lines HLa and HLb may constitute a conductive mesh structure.

The electrode voltage lines HLa and HLb may be integrally formed with a second storage capacitor plate CE2' of a storage capacitor Cst' included in a dummy pixel circuit, similar to the pixel circuit of FIG. 8.

Although some driving voltage lines PLa are arranged apart from each other at opposite sides of first region R1 and the second region R2, because the dummy pixels Pd between the first region R1 and the second region R2 are connected to each other by the electrode voltage lines HLa and HLb, voltage drop with respect to the driving voltage ELVDD may be minimized.

Dummy pixels Pd on the upper or lower side of the first region R1 or the second region R2 may be electrically connected to (and overlap) spaced and aligned driving voltage lines PLa. Dummy pixels Pd between the first region R1 and the second region R2 may be electrically connected to (and overlap) driving voltage lines PLb each continuously extending from the bottom of the first non-display area NDA1 to the top of the first non-display area NDA1 in the second direction.

The dummy pixels Pd between the first region R1 and the second region R2 may also be electrically connected to (and overlap) spaced and aligned electrode voltage lines HLa. The dummy pixels Pd on the upper or lower side of the first region R1 and/or the second region R2 may be electrically connected to (and overlap) electrode voltage lines HLb each continuously extending in the first direction.

According to an embodiment, cut (i.e., spaced and aligned) driving voltage lines PLa or cut (i.e., spaced and aligned) electrode voltage lines HLa are connected to dummy pixels Pd instead of pixels P; accordingly, the dummy pixels Pd serve as a buffer for voltage characteristics. Thus, characteristics of pixels P may be stabilized.

FIGS. 10 to 13 each illustrate a plan view of a portion of a display panel according to an embodiment.

Referring to FIGS. 10 to 13, sizes and/or shapes of the first region R1 and the second region R2 may be configured according to embodiments. For example, a diameter of the first region R1 may be greater than that of the second region R2.

Figure 10:
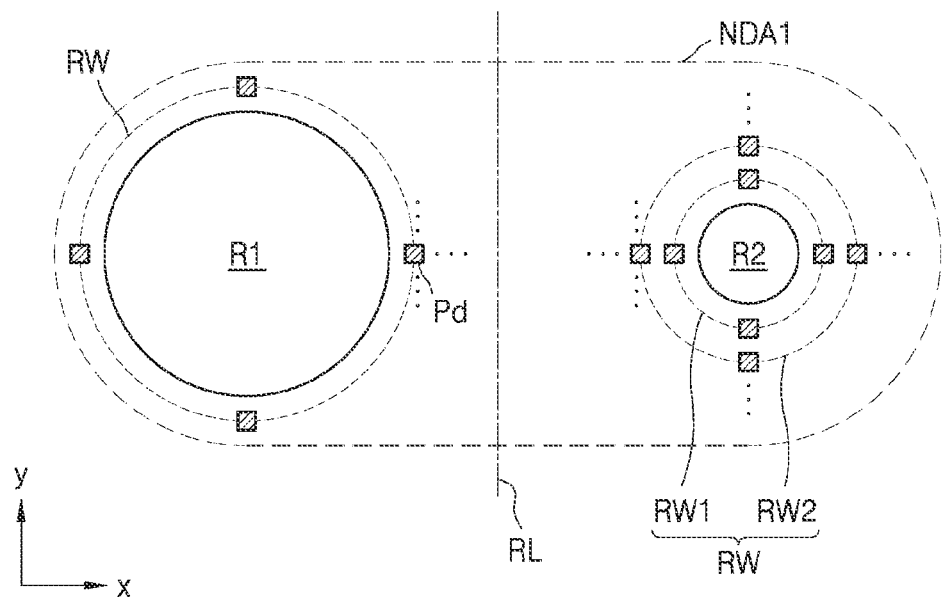
FIG. 10 is a plan view of a portion of a display panel according to an embodiment.

In the embodiment of FIG. 10, even when the first region R1 and the second region R2 have different sizes and/or different shapes, a portion of the first non-display area NDA1 may be between the first region R1 and the second region R2, and an outer boundary of the first non-display area may be symmetrical about a reference line RL extending in the second direction (y direction). The number of rows/layers of dummy pixels Pd that surround the first region R1 may be different from that of rows/layers of dummy pixels Pd that surround the second region R2.

For example, one row/layer/circle RW of dummy pixels Pd may surround the first region R1, and a first row/layer/circle RW1 and a second row/layer/circle RW2 of dummy pixels Pd may surround the second region R2.

The number of dummy pixels Pd between the reference line RL and the first region R1 may be different from (i.e., unequal to) that of dummy pixels Pd between the reference line RL and the second region R2.

Figure 11:
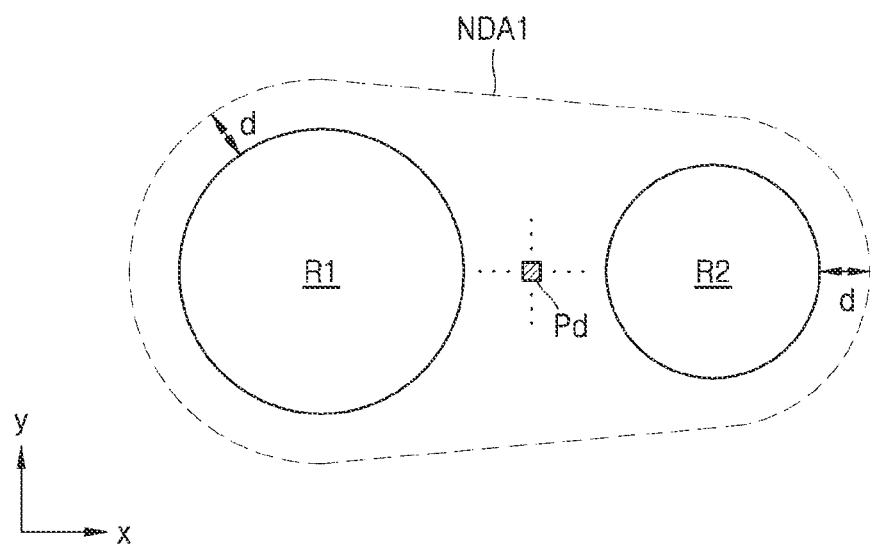
FIG. 11 is a plan view of a portion of a display panel according to an embodiment.

In the embodiment of FIG. 11, a left edge of the first non-display area NDA1 may be spaced from the first region R1 by a distance of d, and a right edge of the first non-display area NDA1 may be spaced from the second region R2 by the distance of d. A width of the first non-display area NDA1 in the second direction may gradually decrease in the first direction between the first region R1 and the second region R2.

Figure 12:
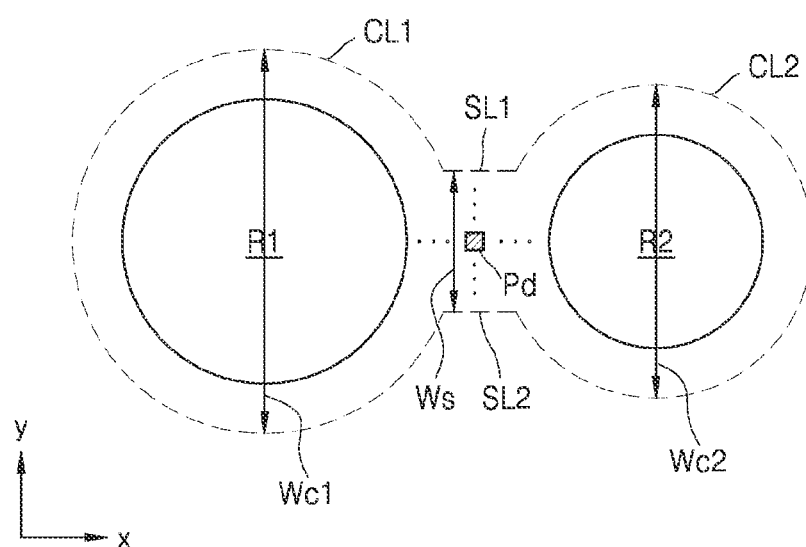
FIG. 12 is a plan view of a portion of a display panel according to an embodiment.

In the embodiment of FIG. 12, the outline (or outer boundary) of the first non-display area NDA1 may include a curve CL1 curving along the edge of the first region R1, a curve CL2 curving along the edge of the second region R2, and two straight lines SL1 and SL2 which are parallel to each other and connect the curves CL1 and CL2 to each other. Accordingly, a maximum width Ws between the two straight lines SL1 and SL2 is smallest among maximum widths of three sections of the first non-display area NDA1 in the second directions. (Ws<Wc1; Ws<Wc2)

Figure 13:
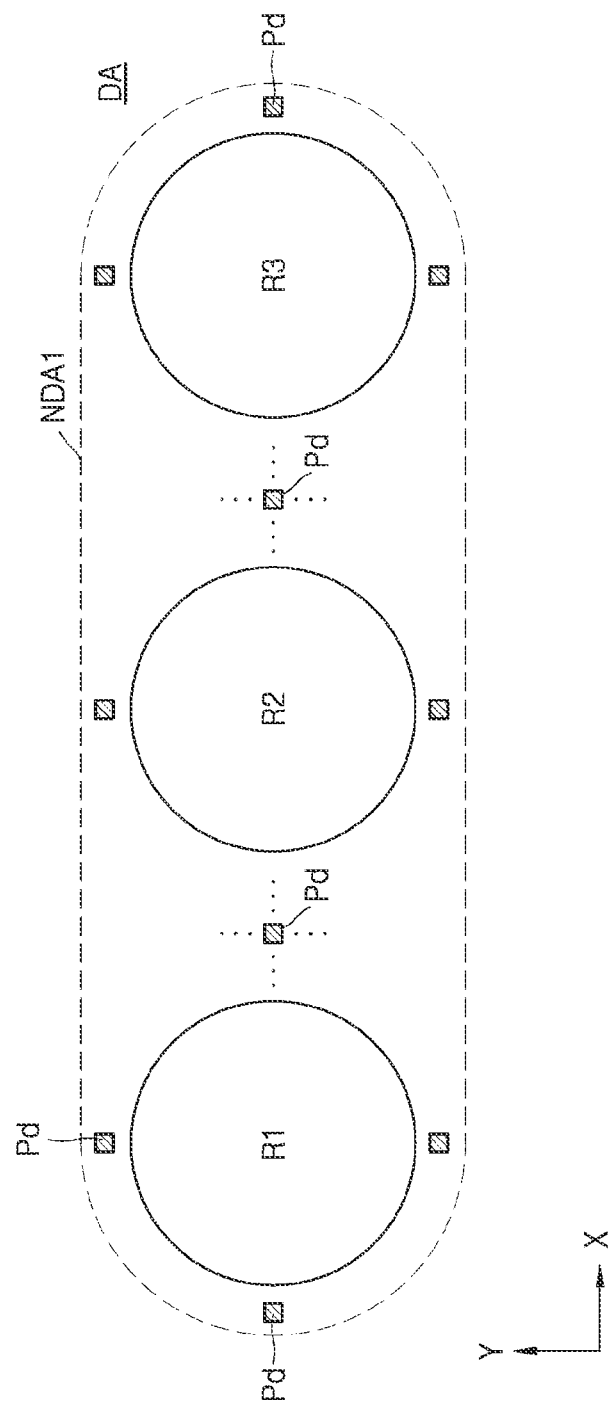
FIG. 13 is a plan view of a portion of a display panel according to an embodiment.

Referring to FIG. 13, a display panel may include a first region R1, a second region R2, and a third region R3 serving as opening regions or transmissive regions. A display panel may include four or more opening regions or transmissive regions.

Dummy pixels Pd may be between the first region R1 and the second region R2 and between the second region R2 and the third region R3. Dummy pixels Pd may also be arranged on the left side of the first region R1 and on the right side of the third region R3. Dummy pixels Pd may also be arranged on the upper and lower sides of the regions R1, R2, and R3.

As the dummy pixels Pd are arranged in the first non-display area NDA1, sufficient uniformity of a pattern density and sufficient uniformity of an electrical load may be attained.

According to embodiments, dummy pixels are arranged between regions corresponding to electronic elements, such as a sensor or a camera, and thus a pattern density and a load may be uniform, and thus high-quality display panels may be provided.

Embodiments described herein should be considered in an illustrative sense and not for purposes of limitation. Descriptions of features or aspects within each embodiment may be available for other embodiments.

While embodiments have been described with reference to the figures, various changes in form and details may be made without departing from the scope defined by the following claims.

What is claimed is:

1. A display panel comprising:
 a substrate including a first transmission region, a non-display area that surrounds the first transmission region, and a display area that surrounds the non-display area;
 emitting pixels arranged on the display area, including a first emitting pixel, and configured to emit light;
 dummy pixels arranged on the non-display area, including a first dummy pixel, and configured to emit no light;
 driving voltage lines configured to transmit driving voltages to the emitting pixels and the dummy pixels; and
 a first scan line extending in a first direction and crossing at least some of the driving voltage lines and overlapping at least some of dummy pixels,
 wherein the driving voltage lines extend in a second direction across the first direction and include a first driving voltage line and a second driving voltage line, the second driving voltage line is arranged in a line with the first driving voltage line along the second direction,
 wherein the first transmission region is positioned in the second direction between the first driving voltage line and the second driving voltage line,
 wherein the first driving voltage line overlaps the first dummy pixel,
 wherein the first scan line is continuously arranged in the non-display area,
 wherein the driving voltage lines further include a third driving voltage line,
 wherein the first driving voltage line and the second driving voltage line intersect a boundary of the non-display area once, and
 wherein the third driving voltage line intersects the boundary of the non-display area at least twice.

2. The display panel of claim 1, wherein the dummy pixels surround the first transmission region.

3. The display panel of claim 1, wherein the first emitting pixel comprises a pixel circuit and a display element, the pixel circuit comprising at least one transistor, the display element being electrically connected to the pixel circuit,
 wherein the first dummy pixel comprises a dummy pixel circuit comprising at least one dummy transistor, and
 wherein a structure of the pixel circuit is same as a structure of the dummy pixel circuit.

4. The display panel of claim 1, further comprising electrode voltage lines intersecting the driving voltage lines and electrically connected to the driving voltage lines via contact holes to form a conductive mesh structure.

5. The display panel of claim 4,
wherein the dummy pixels include a second dummy pixel,
wherein the electrode voltage lines include a first electrode voltage line and a second electrode voltage line,
wherein the first electrode voltage line is spaced from the second electrode voltage line, is aligned with the second electrode voltage line, and overlaps the second dummy pixel, and
wherein the first transmission region is positioned between the first electrode voltage line and the second electrode voltage line.

6. The display panel of claim 4,
wherein the first dummy pixel comprises a dummy pixel circuit,
wherein the dummy pixel circuit comprises a driving thin-film transistor and a storage capacitor that overlaps the driving thin-film transistor, and
wherein one electrode of the storage capacitor is one of the electrode voltage lines.

7. A display device comprising:
a substrate including a first transmission region, a second transmission region, a non-display area that surrounds the first transmission region and the second transmission region, and a display area that surrounds the non-display area;
electronic elements under the first transmission region and a second transmission region of the substrate;
emitting pixels arranged on the display area, and configured to emit light;
dummy pixels arranged on the non-display area, and configured to emit no light; and
driving voltage lines configured to transmit driving voltages to the emitting pixels and the dummy pixels,
wherein some of the dummy pixels are disposed between the first transmission region and the second transmission region2
wherein the driving voltage lines include a first driving voltage line, a second driving voltage line, and a third driving voltage line,
wherein the first driving voltage line and the second driving voltage line intersect a boundary of the non-display area once, and
wherein the third driving voltage line intersects the boundary of the non-display area at least twice.

8. The display device of claim 7, wherein the second transmission region is smaller than the first transmission region.

9. The display device of claim 8, wherein the total number of dummy pixels that surround the first transmission region without surrounding the second transmission region is less than the total number of dummy pixels that surround the second transmission region without surrounding the first transmission region.

10. The display device of claim 8, wherein the first transmission region and the second transmission region are disposed along a first direction, and
wherein a width of the non-display area in a second direction across the first direction gradually decrease in the first direction between the first transmission region and the second transmission region.

11. The display device of claim 8, wherein the first transmission region and the second transmission region are disposed along a first direction, and
wherein a width of the non-display area in a second direction across the first direction between the first transmission region and the second transmission region is smaller than a width of the second transmission region in the second direction.

12. The display device of claim 7, further comprising a third transmission region both spaced apart from the first transmission region and the second transmission region, the third transmission region is surrounded by the non-display area.

13. The display device of claim 7,
wherein the first driving voltage line is spaced from the second driving voltage line and is aligned with the second driving voltage line,
wherein the first transmission region is positioned between the first driving voltage line and the second driving voltage line, and
wherein the third driving voltage line is longer than each of the first driving voltage line and the second driving voltage line.

14. The display device of claim 13,
wherein dummy pixels include a first dummy pixel, and
wherein the first driving voltage line overlaps the first dummy pixel.

15. The display device of claim 7, further comprising electrode voltage lines intersecting the driving voltage lines and electrically connected to the driving voltage lines via contact holes to form a conductive mesh structure.

16. A display device comprising:
a substrate including a first transmission region, a second transmission region, a non-display area that surrounds the first transmission region and the second transmission region, and a display area that surrounds the non-display area;
electronic elements under the first transmission region and a second transmission region of the substrate;
emitting pixels arranged on the display area, and configured to emit light;
dummy pixels arranged on the non-display area, and configured to emit no light; and
driving voltage lines configured to transmit driving voltages to the emitting pixels and the dummy pixels,
wherein the dummy pixels surround the first transmission region and the second transmission region,
wherein the driving voltage lines include a first driving voltage line, a second driving voltage line, and a third driving voltage line,
wherein the first driving voltage line and the second driving voltage line intersect a boundary of the non-display area once, and
wherein the third driving voltage line intersects the boundary of the non-display area at least twice.

\* \* \* \* \*